(12) United States Patent
Vela-Becerra et al.

(10) Patent No.: US 10,872,734 B2
(45) Date of Patent: Dec. 22, 2020

(54) SOLVENT-FREE, SOLID PHASE SYNTHESIS OF HYBRID LEAD HALIDE PEROVSKITES WITH SUPERIOR PURITY

(71) Applicants: Javier Vela-Becerra, Ames, IA (US); Bryan A. Rosales, Ames, IA (US)

(72) Inventors: Javier Vela-Becerra, Ames, IA (US); Bryan A. Rosales, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 52 days.

(21) Appl. No.: 15/854,596

(22) Filed: Dec. 26, 2017

(65) Prior Publication Data

US 2018/0204682 A1 Jul. 19, 2018

Related U.S. Application Data

(60) Provisional application No. 62/447,800, filed on Jan. 18, 2017.

(51) Int. Cl.
| | |
|---|---|
| *C07F 7/24* | (2006.01) |
| *H01G 9/20* | (2006.01) |
| *H01L 51/00* | (2006.01) |
| *H01G 9/00* | (2006.01) |
| *H01L 51/44* | (2006.01) |
| *H01L 51/42* | (2006.01) |

(52) U.S. Cl.
CPC ........... *H01G 9/2004* (2013.01); *C07F 7/24* (2013.01); *H01G 9/0029* (2013.01); *H01G 9/2077* (2013.01); *H01L 51/005* (2013.01); *H01L 51/0025* (2013.01); *H01L 51/0077* (2013.01); *H01L 51/422* (2013.01); *H01L 51/4253* (2013.01); *H01L 51/441* (2013.01); *H01L 51/448* (2013.01); *Y02E 10/549* (2013.01)

(58) Field of Classification Search
None
See application file for complete search history.

(56) References Cited

PUBLICATIONS

Zarick et al. J. Mater. Chem. A. 2018, 6, 5507-5537.*
Rosales et al. Chem. Mater. 2016, 28, 19, 6848-6859.*
Kaltzoglou et al., Electrochim. Acta, 2015, 184 466-474.
Sourisseau et al., Inorg. Chem., 2007, 46, 6148-6154.
Roiland et al.; Phys. Chem. Chem. Phys., 2016, 18, 27133-27142.

* cited by examiner

*Primary Examiner* — Clinton A Brooks
(74) *Attorney, Agent, or Firm* — Reinhart Boerner Van Deuren P.C.

(57) ABSTRACT

A method of synthesizing a mixed-halide perovskite is disclosed herein. The method includes the steps of mixing a first single-halide perovskite and a second single-halide perovskite to form a solid phase mixture and heating the solid phase mixture at a temperature below a first decomposition temperature of the first single-halide perovskite and below a second decomposition temperature of the second single-halide perovskite for a time sufficient to form the mixed-halide perovskite. During the mixing, the first and second single-halide perovskite are both in the solid phase. A mixed-halide perovskite made according to the method is also disclosed herein. The mixed-halide perovskite is free of amorphous and/or semicrystalline phases. The mixed-halide perovskite can be utilized in a photovoltaic cell in a solar panel.

26 Claims, 20 Drawing Sheets
(5 of 20 Drawing Sheet(s) Filed in Color)

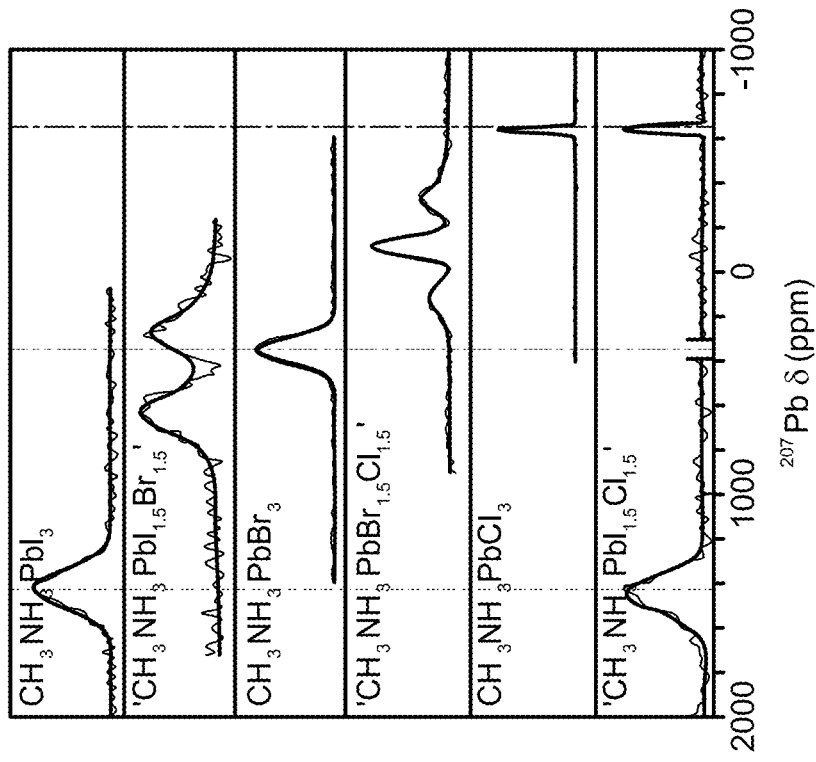
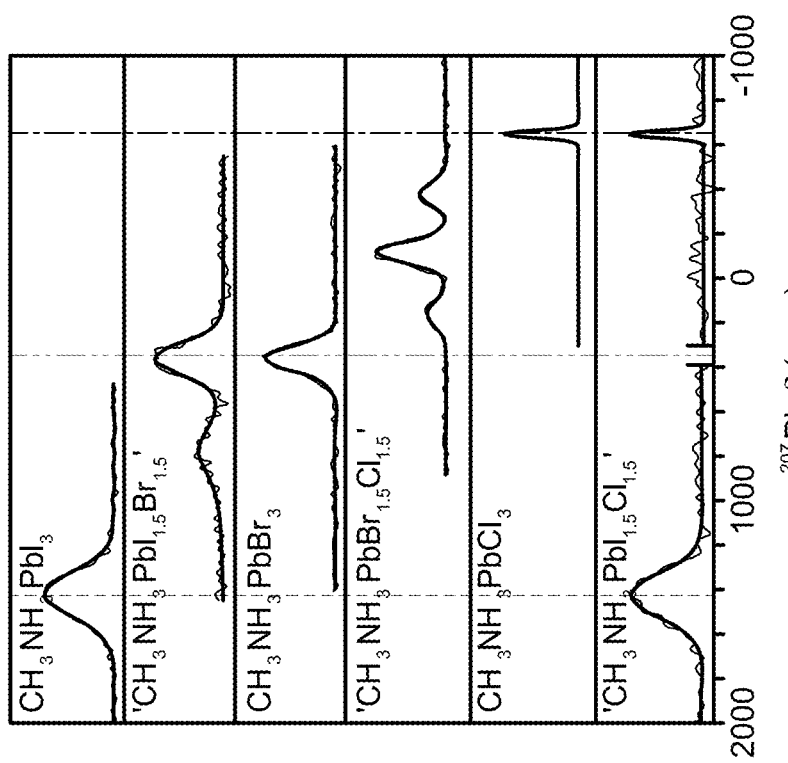
FIG. 8A
FIG. 8B

| Temp (°C) | Band Gap (eV) | Band Gap (nm) |
|---|---|---|
| 250 | 1.92 | 645 |
| 200 | 1.99 | 622 |
| 150 | 2.04 | 608 |
| 100 | 2.02 | 613 |
| 50 | 2.03 | 610 |
| 20 | 2.02 | 615 |

| Temp (°C) | Band Gap (eV) | Band Gap (nm) |
|---|---|---|
| 200 | 2.53 | 491 |
| 150 | 2.53 | 490 |
| 100 | 2.53 | 491 |
| 50 | 2.52 | 492 |
| 20 | 2.54 | 489 |

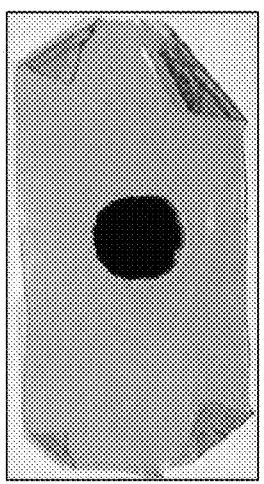 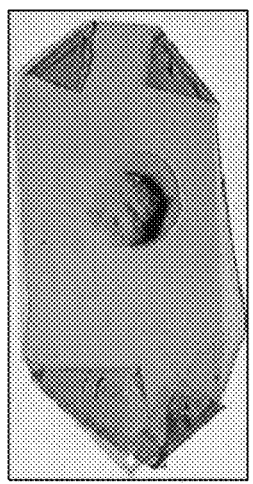 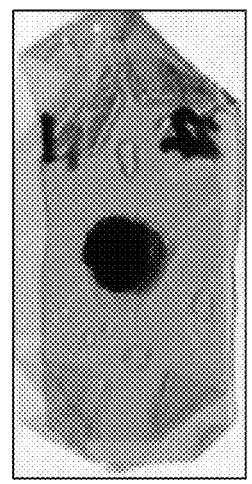 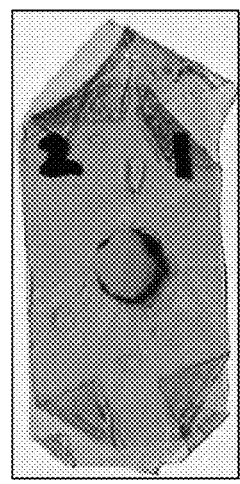
FIG. 16A    FIG. 16B    FIG. 16C    FIG. 16D
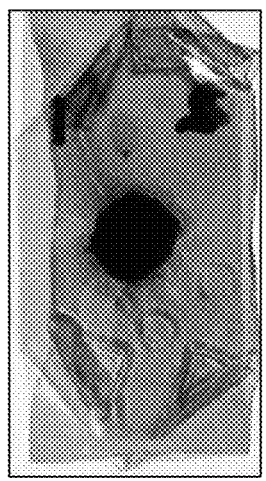 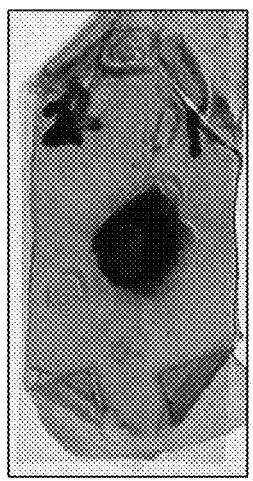 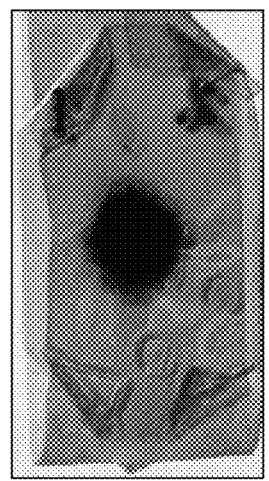 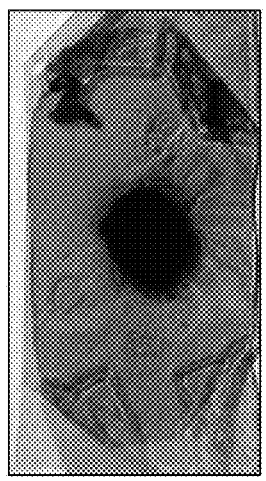
FIG. 16E    FIG. 16F    FIG. 16G    FIG. 16H
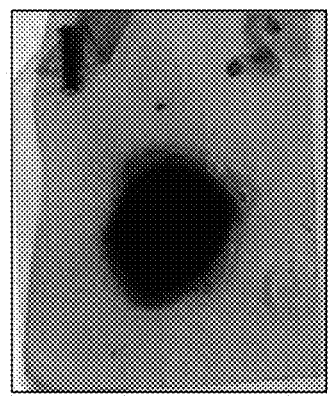 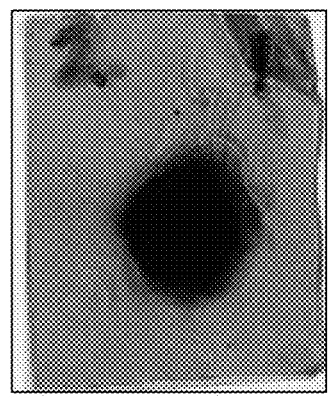
FIG. 16I    FIG. 16J

SOLVENT-FREE, SOLID PHASE SYNTHESIS OF HYBRID LEAD HALIDE PEROVSKITES WITH SUPERIOR PURITY

CROSS-REFERENCE TO RELATED PATENT APPLICATION

This patent application claims the benefit of U.S. Provisional Patent Application No. 62/447,800, filed Jan. 18, 2017, the entire teachings and disclosure of which are incorporated herein by reference thereto.

STATEMENT REGARDING FEDERALLY SPONSORED RESEARCH AND DEVELOPMENT

This invention was made in part with Government support under Grant Number DE-AC02-07CH11358 awarded by the Department of Energy. The Government has certain rights in this invention.

FIELD OF THE INVENTION

This invention generally relates to perovskite compounds and, more particularly, to a method for preparing hybrid lead, mixed-halide perovskite compounds without using a solvent.

BACKGROUND OF THE INVENTION

Perovskites are optically active, semiconducting compounds that are known to display intriguing electronic, light-emitting and chemical properties. Over the last few years, lead-halide perovskites have become one of the most promising semiconductors for solar cells due to their low cost, easier processability, and high power conversion efficiencies. Photovoltaics made of these materials now reach power conversion efficiencies of more than 20 percent.

Halides are simple and abundant, negatively charged compounds, such as iodide, bromide and chloride. Mixed-halide perovskites are of interest over single-halide perovskites for a variety of reasons. Mixed-halide perovskites appear to benefit from enhanced thermal and moisture stability, which makes them degrade less quickly than single-halide perovskites. They can be fine-tuned to absorb sunlight at specific wavelengths, which makes them useful for tandem solar cells and many other applications, including light emitting diodes (LEDs). Using these compounds, scientists can control the color and increase the efficiency of such energy conversion devices.

Scientists have found that depending on how the material is made there can be significant nonstoichiometric impurities or "dopants" permeating the material, which could significantly affect the material's chemistry, moisture stability and transport properties.

BRIEF SUMMARY OF THE INVENTION

In one aspect, methods of synthesizing a mixed-halide perovskite are provided. Generally, embodiments of the disclosed methods include the steps of mixing a first single-halide perovskite and a second single-halide perovskite to form a solid-phase mixture and heating the solid phase mixture at a temperature below a first decomposition temperature of the first single-halide perovskite and below a second decomposition temperature of the second single-halide perovskite for a time sufficient to form the mixed-halide perovskite. During mixing, the first single-halide perovskite and the second single-halide perovskite are both in the solid phase.

In a particular embodiment, the mixed-halide perovskite has the formula $CH_3NH_3PbX_{3-a}X'_a$, wherein X and X' are selected from the group consisting of I, Br, and Cl, and wherein $0>a>3$. In such an embodiment, the temperature is generally approximately 200° C. Additionally, the time can be between 0.5 and 1 hour.

In another particular embodiment, the mixed-halide perovskite has the formula $HC(NH_2)_2PbX_{3-a}X'_a$, X and X' are selected from the group consisting of I, Br, and Cl, and a is between 0 and 3. In still another particular embodiment, the mixed-halide perovskite has the formula $APbX_{3-a}X'_a$, A is an alkali metal, X and X' are selected from the group consisting of I, Br, and Cl, and a is between 0 and 3. Moreover, A is Rb or Cs. In still another particular embodiment, the mixed-halide perovskite has the formula $A_{1-b}A'_bPbX_{3-a}X'_a$, A is an alkali metal, A' is an organic cation, X and X' are selected from the group consisting of I, Br, and Cl, and a is between 0 and 3. For instance, A can be Rb or Cs, and A' can be $CH_3NH_3$ or $HC(NH_2)_2$.

According to certain embodiments of the method disclosed herein, the mixed-halide perovskite can be free of any semicrystalline phases.

In certain embodiments, the method further includes the step of annealing the mixed-halide perovskite at a temperature of approximately 200° C. for up to 1 hour (e.g., in a vial) and 72 hours (e.g., as a film).

In another aspect, a mixed-halide perovskite made according to the described method is provided. In certain embodiments, the mixed-halide perovskite is free of amorphous and/or semicrystalline phases.

In certain embodiments, the mixed-halide perovskite has the formula $CH_3NH_3PbX_{3-a}X'_a$ in which X and X' are selected from the group consisting of I, Br, and Cl and in which a is between 0 and 3. In certain other embodiments, the mixed-halide perovskite has the formula $HC(NH_2)_2PbX_{3-a}X'_a$, in which X and X' are selected from the group consisting of I, Br, and Cl, and in which a is between 0 and 3. In still other embodiments, the mixed-halide perovskite has the formula $APbX_{3-a}X'_a$, in which A is an alkali metal, in which X and X' are selected from the group consisting of I, Br, and Cl, and in which a is between 0 and 3. Particularly, A can be Rb or Cs. In still another particular embodiment, the mixed-halide perovskite has the formula $A_{1-b}A'_bPbX_{3-a}X'_a$, A is an alkali metal, A' is an organic cation, X and X' are selected from the group consisting of I, Br, and Cl, and a is between 0 and 3. For example, A can be Rb or Cs, and A' can be $CH_3NH_3$ or $HC(NH_2)_2$.

In still another aspect, a photovoltaic cell is provided herein. The photovoltaic cell includes a transparent cover, a first contact strip, a p-type semiconductor, a junction layer, an n-type semiconductor, and a second contact strip. The junction layer is a mixed-halide perovskite that is free of amorphous and semicrystalline phases.

In embodiments, the mixed-halide perovskite used as the junction layer has the formula $CH_3NH_3PbX_{3-a}X'_a$, in which X and X' are selected from the group consisting of I, Br, and Cl, and in which a is between 0 and 3. In other embodiments, the mixed-halide perovskite has the formula $HC(NH_2)_2PbX_{3-a}X'_a$, in which X and X' are selected from the group consisting of I, Br, and Cl and in which a is between 0 and 3. In still another embodiment, the mixed-halide perovskite has the formula $APbX_{3-a}X'_a$, in which A is an alkali metal, in which X and X' are selected from the group consisting of I, Br, and Cl, and in which a is between 0 and 3. Particularly, A can be Rb or Cs. In still another particular embodiment, the mixed-halide perovskite has the formula $A_{1-b}A'_bPbX_{3-a}X'_a$, A is an alkali metal, A' is an organic cation, X and X' are selected from the group consisting of I, Br, and Cl, and a is between 0 and 3. In exemplary embodiments, A can be Rb or Cs, and A' can be $CH_3NH_3$ or $HC(NH_2)_2$. The photovoltaic cell can be used in a solar panel.

Other aspects, objectives and advantages of the invention will become more apparent from the following detailed description when taken in conjunction with the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings incorporated in and forming a part of the specification illustrate several aspects of the present invention and, together with the description, serve to explain the principles of the invention. In the drawings:

FIGS. 8A and 8B depict $^{207}$Pb ssNMR spectra of single- and mixed-halide lead perovskites prepared by solution phase synthesis under static (FIG. 8A) and 10 kHz (FIG. 8B) spinning conditions at 22° C. (solid black lines were fit using Bruker's Topspin 3.0 software);

FIGS. 16A-16J depict images of certain stages of preparation of solid phase synthesized hybrid lead, mixed halide perovskites;

Figure 1A:
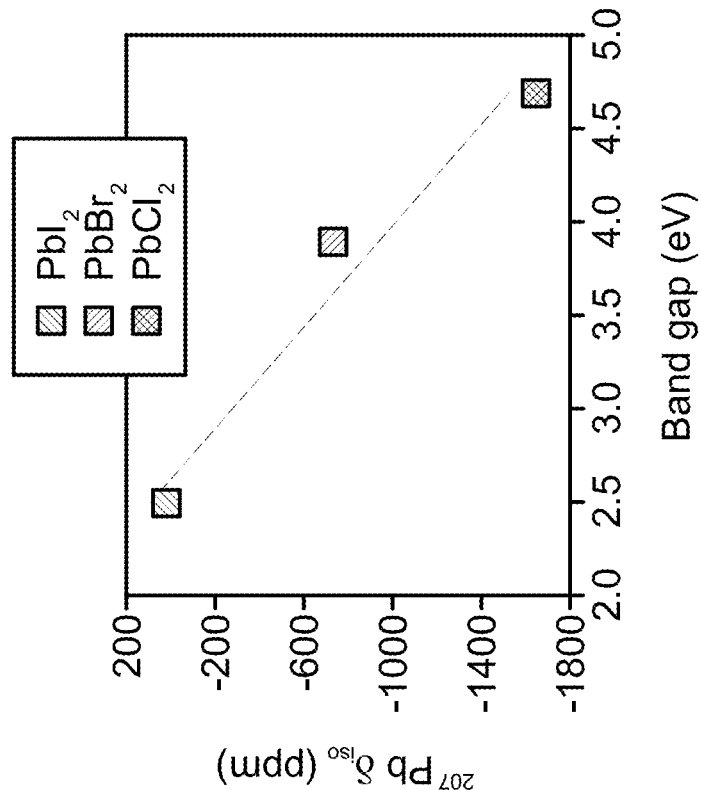
FIGS. 1A and 1B depict $^{207}$Pb $\delta_{iso}$ as a function of average halogen Pauling electronegativity (FIG. 1A) and band gap (FIG. 1B) for $PbX_2$ (X=I, Br, Cl)

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Hybrid lead halide perovskites (such as $CH_3NH_3PbX_3$, X=I, Br, Cl) have emerged as promising semiconductors for photovoltaics due to their low cost, solution processability, and high power conversion efficiencies (>21-22%). Among their many interesting properties, hybrid lead halide perovskites benefit from large absorption coefficients, low exciton binding energies, long exciton diffusion lengths, high dielectric constants, and intrinsic ferroelectric polarization. In particular, organolead mixed-halide perovskites, such as methylammonium and formamidinium lead halide perovskites ($CH_3NH_3PbX_{3-a}X'_a$ and $HC(NH_2)_2PbX_{3-a}X'_a$, respectively; X, X'=I, Br, Cl), are of particular interest because they appear to further benefit from enhanced moisture stability, improved carrier relaxation time, and visible range tunability. Other interesting perovskites include alkali-metal lead halide perovskites (e.g., $APbX_{3-a}X'_a$; A=Rb or Cs; X, X'=I, Br, Cl). Still further, perovskites can include both alkali metals and organic cations. These perovskites have the formula $A_{1-b}A'_bPbX_{3-a}X'_a$ (A is an alkali metal such as Rb or Cs; A' is an organic cation such as $CH_3NH_3$ or $HC(NH_2)_2$; X, X'=I, Br, Cl). Such mixed-halide perovskites are useful in tandem solar cells, and because they also display intense photoluminescence, they have potential utility in light emitting devices (LEDs).

The traditional solution phase approach to synthesize of hybrid lead mixed-halide perovskites results in the presence of a significant amount of impurities (ca. 74%) identified as semicrystalline phases. Importantly, because the best perovskite absorbing materials for photovoltaic solar cells are composed of such hybrid perovskites, namely those containing a mixture of multiple cations and anions in their structure, the presence or absence of these additional phases needs to be accounted for and controlled in order to reliably understand and improve device performance or properties.

In order to address the deficiencies of solution phase synthesis of hybrid lead, mixed-halide perovskites, a solid phase synthesis approach is disclosed herein. In brief, the solid phase synthesis approach involves mixing two single-halide perovskites at a desired stoichiometric ratio and heating them in the absence of solvent(s) at a temperature below their decomposition temperature for a set period of time. The desired products form without the formation of amorphous impurities or semicrystalline phases. Through the use of extensive physical characterization techniques, including $^{207}Pb$ solid state nuclear magnetic resonance (ssNMR) spectroscopy, it can be demonstrated that solid phase synthesis is greatly superior to traditional wet or solution phase synthesis methods in preparing hybrid lead mixed-halide perovskites.

Figure 1B:
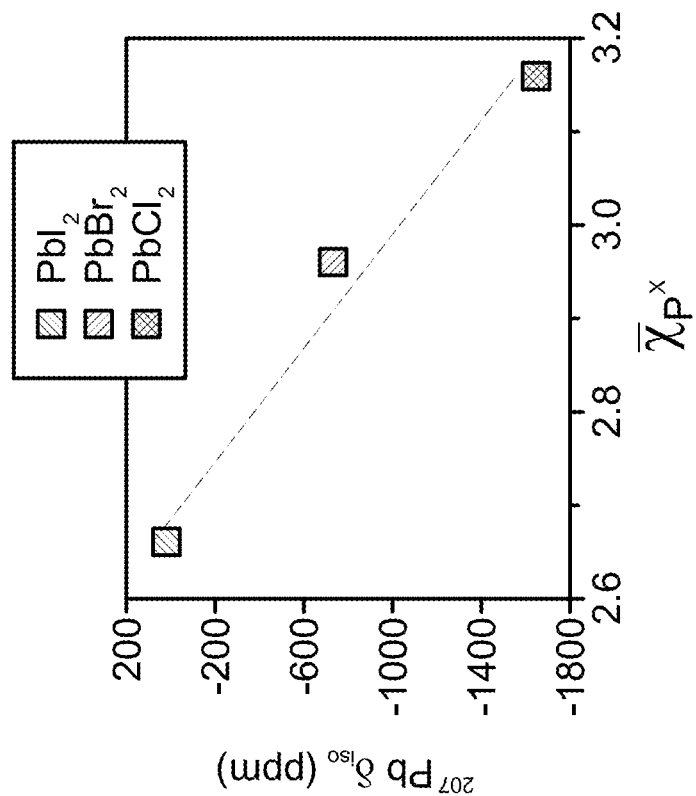

Among the techniques used to study the lead halide perovskites, $^{207}Pb$ ssNMR provided valuable information. NMR, in general, is an analytical chemistry technique that provides scientists with physical, chemical, structural and electronic information about complex samples. Because the $^{207}Pb$ nucleus is highly sensitive to local electronic structure, $^{207}Pb$ ssNMR can probe all crystalline, semicrystalline, and amorphous phases, and provide information about the different lead sites that may be present in mixed-halide perovskites. In particular, $^{207}Pb$ ssNMR is highly sensitive to local electronic structure, coordination environment, ligand electronegativity, and temperature because the $^{207}Pb$ nucleus has a spin of ½, 22.6% natural abundance, and a chemical shift ($\delta$) range spanning over 10,000 ppm. For example, the $^{207}Pb$ isotropic chemical shift ($\delta_{iso}$) of the lead dihalides ($PbX_2$; X=I, Br, Cl) varies linearly with halide electronegativity and ionization energy as shown in FIGS. 1A and 1B.

In the experimental studies conducted in support of the present disclosure, $^{207}Pb$ solid state (ss) NMR spectra were measured on a Bruker Widebore 14.1 T (600 MHz) NMR spectrometer equipped with an AVANCE-II console. All spectra were acquired using a 4 mm magic-angle spinning (MAS) probe in double resonance mode. Samples were packed into 4 mm Kel-F rotor inserts, which were then inserted into a 4 mm zirconia rotor. The rotor inserts were used to prevent contamination and for center packing, ensuring very little sample would be outside of the radiofrequency coil. The $^{207}Pb$ resonant frequency was 125.55 MHz with the carrier frequency adjusted depending on the varying Pb chemical shifts of each sample. $Pb(NO_3)_2$ ($\delta$=−3490 ppm, 22° C.) was used as an external calibration standard. The DEPTH pulse sequence (Bruker's standard "zgbs" pulse sequence) was used to obtain both static and MAS $^{207}Pb$ spectra; this pulse sequence consists of an initial 90° pulse, followed by two 180° pulses spaced by a 2 µs delay. This pulse sequence eliminates very broad probe background $^{207}Pb$ NMR signals, which are likely due to lead in the probe's soldering and electronics.

A 90° pulse length of 3.5 µs was used, with pulse power levels calibrated on $Pb(NO_3)_2$. Spectra were acquired with a 2.1 ms acquisition time and a 10 s recycle delay after each scan. Measurements of $^{207}Pb$ longitudinal relaxation times ($T_1$) for the pure halide phases under static conditions showed that the $^{207}Pb$ $T_1$ was less than 1.4 s in all samples. Therefore, the recycle delay of 10 s provided quantitative signal intensities, which is consistent with the short $^{207}Pb$ $T_1$'s reported in other lead-containing semiconductors. Static and 10 kHz MAS spectra were collected over a period of 1-6 days per sample. To confirm that the observed $^{207}Pb$ NMR spectral broadening was primarily homogeneous, selected spectra were also acquired at a lower magnetic field of 9.4 T under both static and MAS conditions. The 9.4 T experiments were performed on a Bruker wide-bore 400 MHz solid state NMR spectrometer equipped with an AVANCE III HD console.

A 4 mm HXY triple resonance probe configured in a double resonance $^1H$-$^{207}Pb$ mode was used for experiments on the mixed-halide perovskites '$CH_3NH_3PbI_{1.5}Br1.5$' and '$CH_3NH_3PbBr_{1.5}Cl_{1.5}$'. 4.95 µs $^{207}Pb$ 90° pulse widths were used. A 1.3 mm double resonance broadband probe was used for acquisition of $^{207}Pb$ ssNMR spectra of the pure halide perovskites at 9.4 T. MAS $^{207}Pb$ ssNMR spectra were acquired with an MAS frequency of 50 kHz and a rotor synchronized spin echo that had a 40 µs total duration composed of two rotor periods. 1.4 µs 90° and 2.81 µs 180° pulses were used. All $^{207}Pb$ NMR spectra were fit to simple mixed Gaussian/Lorentzian peaks using the solid line shape analysis (SOLA) module v2.2.4 included in the Bruker TopSpin v3.0 software.

Using $^{207}Pb$ ssNMR in combination with UV-vis optical absorption and powder X-ray diffraction, the presence of both nonstoichiometric dopants and phase segregation in lead mixed-halide perovskites were able to be observed, including in samples that were thermally annealed to 200° C. Phase segregation, i.e., forming semicrystalline or amorphous products, occurred when the sample was made by solution phase synthesis, even after thermal annealing, but not when made by the solid phase synthesis method disclosed herein.

For the purposes of comparison, the preparation and resulting properties of solution phase synthesized samples are discussed first. Organolead single- and mixed-halide perovskites ($CH_3NH_3PbX_3$) were prepared by precipitation from solution. As used herein, hypothetical formulas calculated from the synthetic loading alone are written in single quotation marks whereas actual compositional assignments determined from the combination of all of the gathered experimental data are written without single quotation marks.

Briefly, for the solution phase synthesis of halide methylamine precursors, hydroiodic acid (10 mL, 0.075 mol) or hydrobromic acid. (8.6 mL, 0.075 mol) or hydrochloric acid (6.2 mL, 0.075 mol) was added to a solution of excess methylamine (24 mL, 0.192 mol) in ethanol (100 mL) at 0° C., and the mixture was stirred for 2 hours. The mixture was concentrated and dried under vacuum at 60° C. for 12 hours, and recrystallized from ethanol. Lead(II) iodide (99%) and lead(II) bromide (98+%) were purchased from Acros Organics (Geel, Belgium); lead(II) chloride (99.999%) and methylamine solution (33 wt % in ethanol) from Sigma-Aldrich, Inc. (St. Louis, Mo.); hydroiodic acid (ACS, 55-58%), hydrobromic acid (ACS, 47.0-49.0%), hydrochloric acid (ACS, 37.2%), N,N-dimethylformamide ("DMF," 99.9%), and toluene (99.9%) from Fisher Scientific (Porto Salvo, Portugal); acetonitrile (HPLC grade, 99.8%) from EMD Millipore (Darmstadt, Germany). All chemicals were used as received.

For solution phase synthesis, $CH_3NH_3PbI_3$ was synthesized by dissolving $PbI_2$ (0.08 mmol) and $CH_3NH_3I$ (0.24 mmol) in acetonitrile (20 mL), followed by precipitation via the addition of excess toluene. $CH_3NH_3PbBr_3$ and $CH_3NH_3PbCl_3$ were synthesized by dissolving $PbBr_2$ (0.2 mmol) and $CH_3NH_3Br$ (0.2 mmol) or $PbCl_2$ (0.2 mmol) and $CH_3NH_3Cl$ (0.2 mmol) in DMF (5 mL) followed by precipitation via the addition of excess toluene. '$CH_3NH_3PbBr_{1.5}Cl_{1.5}$' was synthesized using the same procedure as $CH_3NH_3PbBr_3$ and $CH_3NH_3PbCl_3$, using 0.1 mmol of each of the four solid precursors. '$CH_3NH_3PbI_{1.5}Br_{1.5}$' was synthesized by dissolving $PbI_2$ (0.072 mmol), $CH_3NH_3I$ (0.216 mmol), $PbBr_2$ (0.072 mmol), and $CH_3NH_3Br$ (0.216 mmol) in a mixture of acetonitrile (20 mL) and DMF (200 µL), followed by precipitation via the addition of excess toluene. '$CH_3NH_3PbI_{1.5}Cl_{1.5}$' was synthesized by dissolving $PbI_2$ (0.108 mmol), $CH_3NH_3I$ (0.108 mmol), $PbCl_2$ (0.108 mmol), and $CH_3NH_3Cl$ (0.108 mmol) in DMF (3 mL). The mixture was concentrated and dried under vacuum, and the resulting solid could be annealed at 100° C. for 1 hour. In general, the solution phase synthesis is described according to Equation 1, below, where X, X'=I, Br, Cl; 3>a>0.

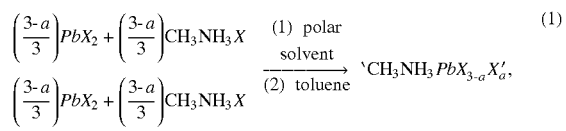

Figure 2A:
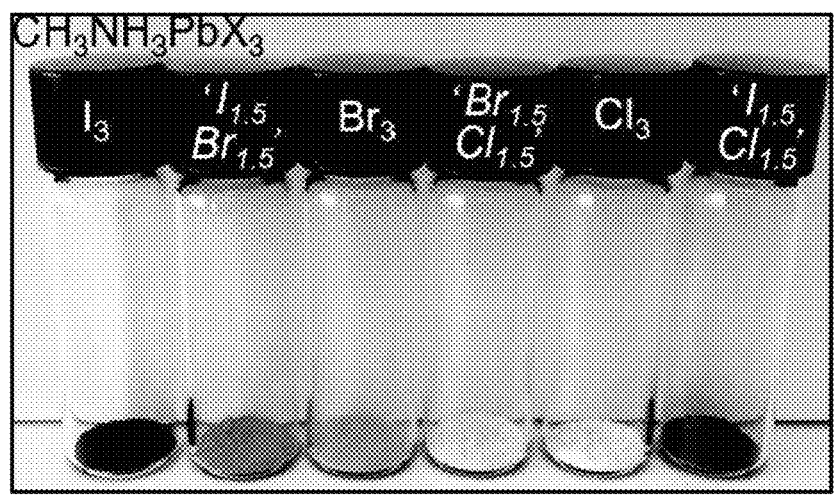
FIGS. 2A and 2B include a representative visual image (FIG. 2A) and diffuse reflectance data (FIG. 2B; N.B. the minimum at 400 nm in FIG. 2B is an instrumental artifact) of solid lead halide perovskites prepared by solution phase synthesis or thermal annealing (as either method gives similar results)
Figure 2B:
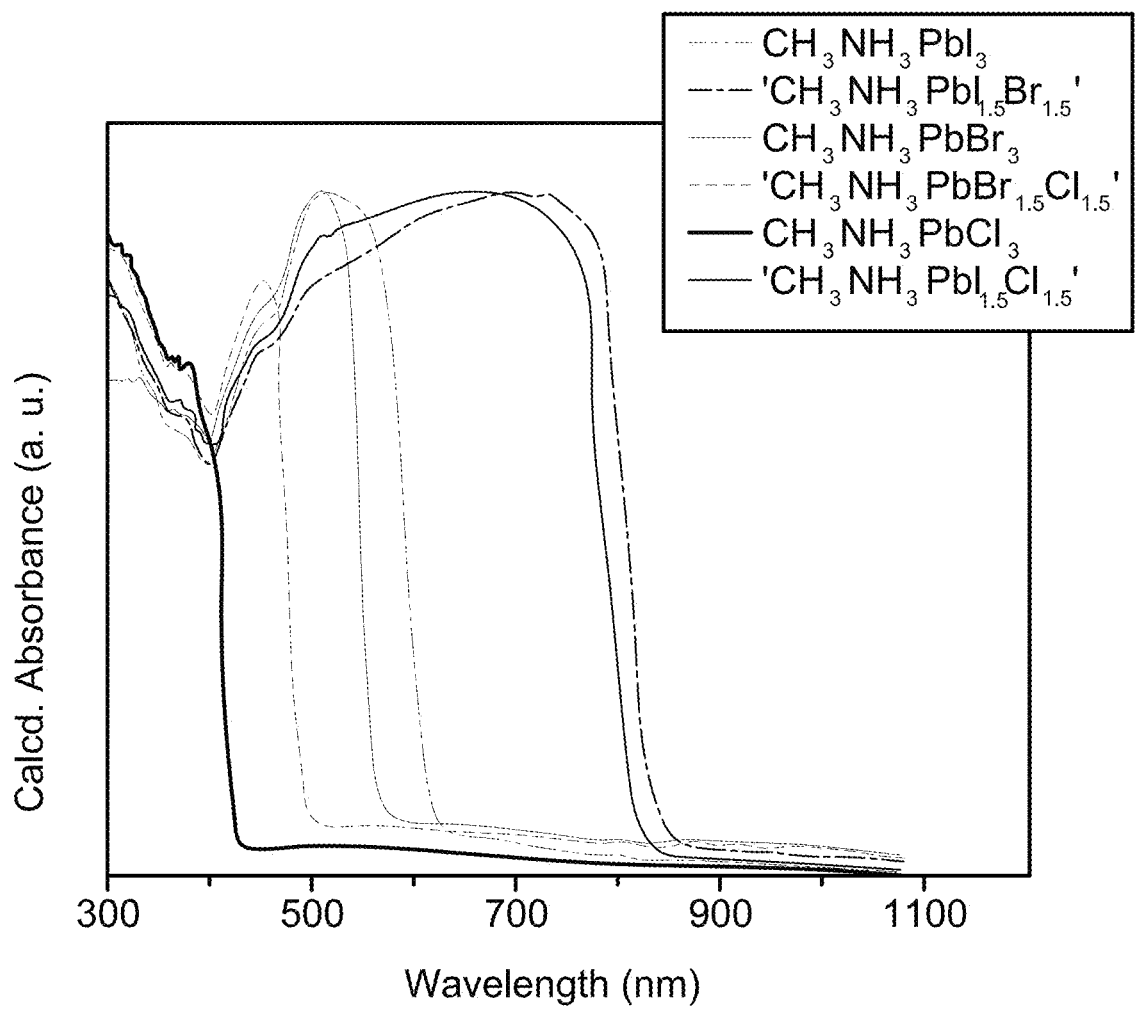

A progressive blue shift in the absorption edge, along with a color change from black to white, as shown in FIG. 2A, are immediately obvious as the perovskite composition changes from the less electronegative iodide to the more electronegative bromide and chloride. Iodo-bromide and bromo-chloride perovskites such as '$CH_3NH_3PbI_{1.5}Br_{1.5}$' and '$CH_3NH_3PbBr_{1.5}Cl_{1.5}$', respectively, have absorption edges that lie in between those of the parent, single-halide perovskites. In contrast, the absorption edges of iodo-chloride perovskites such as '$CH_3NH_3PbI_{1.5}Cl_{1.5}$' mirror that of $CH_3NH_3PbI_3$ as shown in FIG. 2B.

Figure 3A:
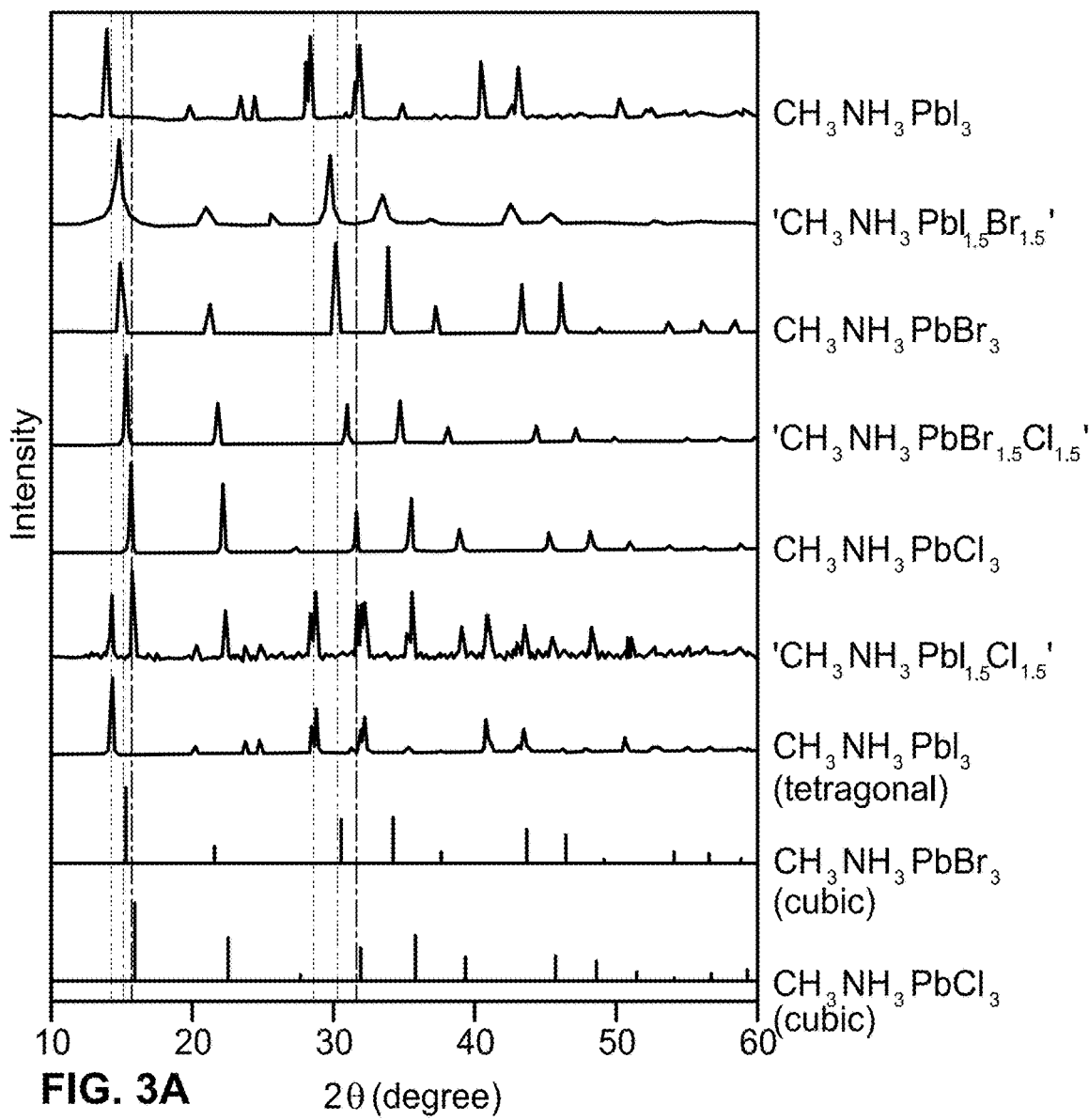
FIGS. 3A and 3B depict powder XRD patterns (FIG. 3A), lattice parameter and absorption edge data (FIG. 3B) as a function of relative halide synthetic loading (%) for lead halide perovskites prepared by solution phase synthesis.

FIG. 3A shows the powder X-ray diffraction (XRD) patterns for several lead halide perovskites prepared by solution phase synthesis. XRD patterns were measured using Cu Kα radiation on a Rigaku Ultima IV (40 kV, 44 mA) using a "background-less" quartz sample holder. Scherrer analysis was performed using a κ value of 0.9. As shown in FIG. 3A, the XRD pattern of $CH_3NH_3PbI_3$ matches the tetragonal standard pattern of its most stable room temperature phase, while those of $CH_3NH_3PbBr_3$ and $CH_3NH_3PbCl_3$ match their cubic standard patterns. Iodo-bromide and bromo-chloride perovskites such as '$CH_3NH_3PbI_{1.5}Br_{1.5}$' and '$CH_3NH_3PbBr_{1.5}Cl_{1.5}$', respectively, show single sets of XRD peaks that are intermediate between those of the parent, pure halide perovskites. Scherrer analysis of the relatively broad XRD peaks of '$CH_3NH_3PbI_{1.5}Br_{1.5}$' yields average single crystalline domain sizes of 36±12 nm. In contrast, iodo-chloride perovskites such as '$CH_3NH_3PbI_{1.5}Cl_{1.5}$' show two distinct sets of XRD peaks that clearly correspond to a physical mixture of phase-segregated $CH_3NH_3PbI_3$ and $CH_3NH_3PbCl_3$ (see FIG. 3A).

Scanning electron microscopy (SEM) was performed on the lead halide perovskite samples. In particular, SEM images were generated with an FEI Quanta 250 field emission SEM at 10-11.5 kV. Samples were prepared by deposition onto an SEM slide with carbon tape, followed by coating with 5 nm of iridium. FIGS. 4A-4E show SEM images of solution phase synthesis samples. The samples generally contain particles with sizes ranging from 0.3-2 µm.

Figure 3B:
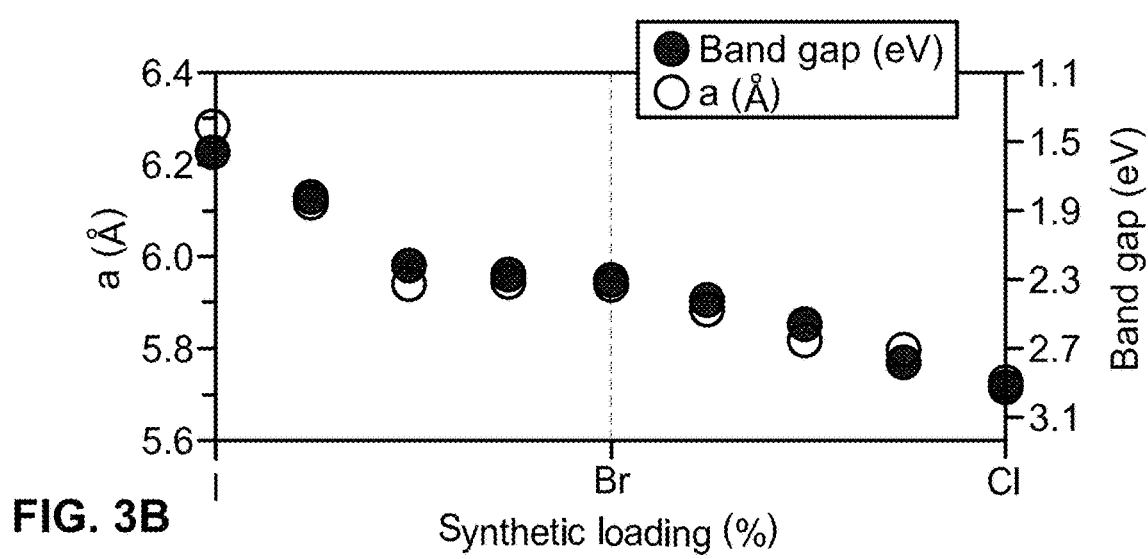
Figures 4A, 4B, 4C, 4D, 4E:
FIGS. 4A-4E depict representative SEM images of $CH_3NH_3PbI_3$ (FIG. 4A), $CH_3NH_3PbBr_3$ (FIG. 4C), and $CH_3NH_3PbCl_3$ (FIG. 4E) made by solution phase synthesis and of '$CH_3NH_3PbI_{1.5}Br_{1.5}$' (FIG. 4B) and '$CH_3NH_3PbBr_{1.5}Cl_{1.5}$' (FIG. 4D) made by solid phase synthesis.

As shown in FIG. 3B, both the absorption edge and lattice parameter of mixed-halide perovskites show a nonlinear dependence or "bowing" on the iodide to bromide ratio, but vary linearly when transitioning from bromide to chloride. In other words, the absorption edge and lattice parameter of '$CH_3NH_3PbI_{3-a}Br_a$' samples made with 0-50% bromide synthetic loading (0≤a≤1.5) are much closer to pure bromide than to iodide. In contrast, the lattice parameter and absorption edge of '$CH_3NH_3PbBr_{1.5}Cl_{1.5}$' lie halfway between pure bromide and chloride. The different behaviors displayed by different mixed-halide systems can be explained in part by crystallography. According to both Hume-Rothery and Vegard rules, tetragonal $CH_3NH_3PbI_3$ and cubic $CH_3NH_3PbBr_3$ may only partially alloy because they do not share the same crystal structure even though their lattice mismatch is small (6.4%) and their halogens have similar electronegativities ($\chi_p$=3.16 for I vs 2.96 for Br) (see Table 1, below).

Cubic $CH_3NH_3PbBr_3$ and cubic $CH_3NH_3PbCl_3$ could form solid solutions because they adopt the same crystal structure, they have a small lattice mismatch (4.5%), and their halogens have similar electronegativities ($\chi_p$=2.96 for Br vs 2.66 for Cl) (see Table 1, below). $CH_3NH_3PbI_3$ and $CH_3NH_3PbCl_3$ cannot be expected to form solid solutions to any significant extent because they form different crystal structures with a large lattice mismatch (11%) and their halogens have very different electronegativities ($\chi_p$=3.16 for I vs 2.66 for Cl) (see Table 1, below). Unsurprisingly, annealed films of '$CH_3NH_3PbI_{3-a}Cl_a$' do not seem to contain chloride within the detection limit of energy-dispersive X-ray spectroscopy (EDS), implying that any incorporation of chloride in the crystal lattice (x) must be extremely low.

TABLE 1

| Selected Data for $CH_3NH_3PbX_3$ Perovskites | | | |
|---|---|---|---|
| X | Lattice parameters (Å) | Δa (%)* | $\bar{\chi}_P^X$ |
| I | 6.3115(a), 6.3161(c) | 6.4 | 3.16 |
| Br | 5.9345(a) | 0 | 2.96 |
| Cl | 5.6694(a) | −4.5 | 2.66 |

*Δa = 100 × [($a_X$ − $a_{Br}$)/$a_{Br}$]

Figure 5:
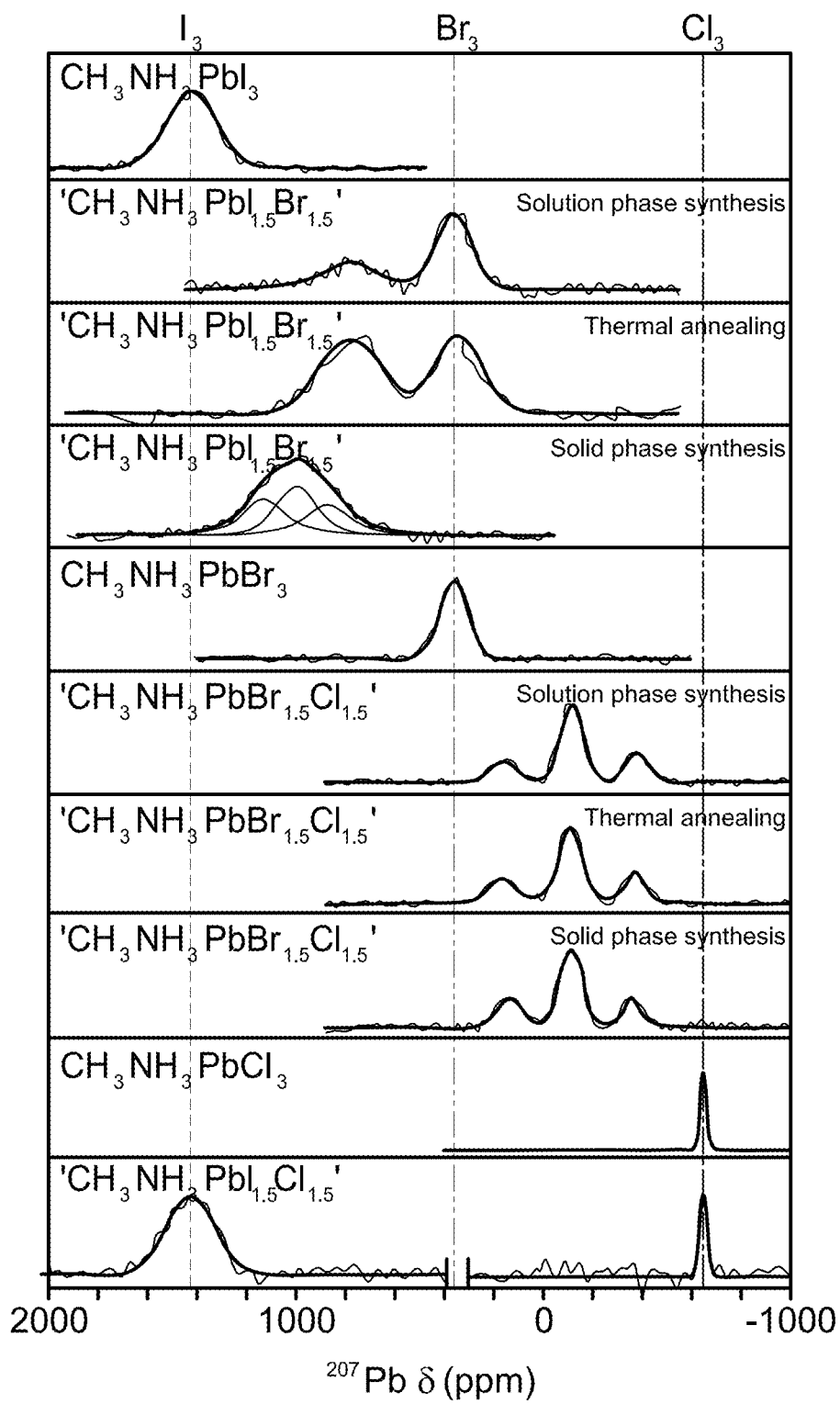
FIG. 5 depicts static $^{207}$Pb ssNMR spectra (22° C.) of representative lead single- and mixed-halide perovskites prepared by solution phase synthesis, thermal annealing, and solid phase synthesis (black curves were fit to mixed Gaussian/Lorentzian peaks)
Figure 6:
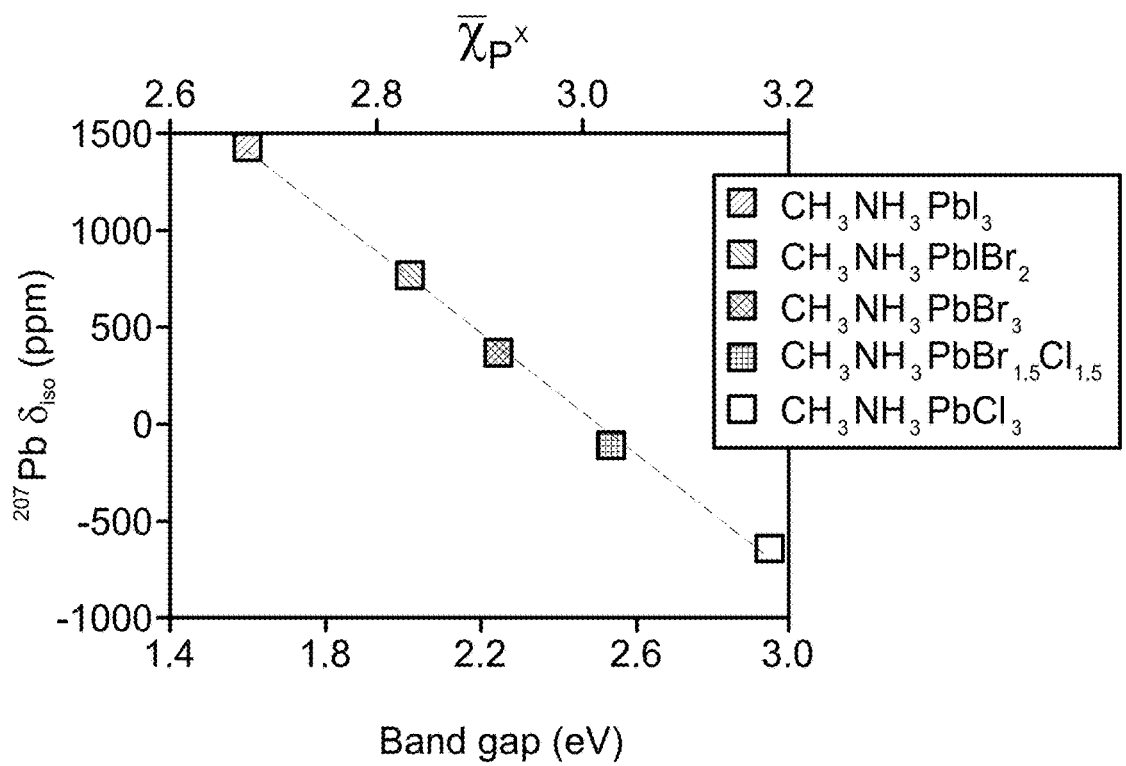
FIG. 6 depicts $^{207}$Pb ssNMR isotropic chemical shifts ($\delta_{iso}$ at 22° C.) observed in single- and mixed-halide lead perovskites prepared by solution phase synthesis as a function of average electronegativity and band gap.
Figures 7A, 7B:
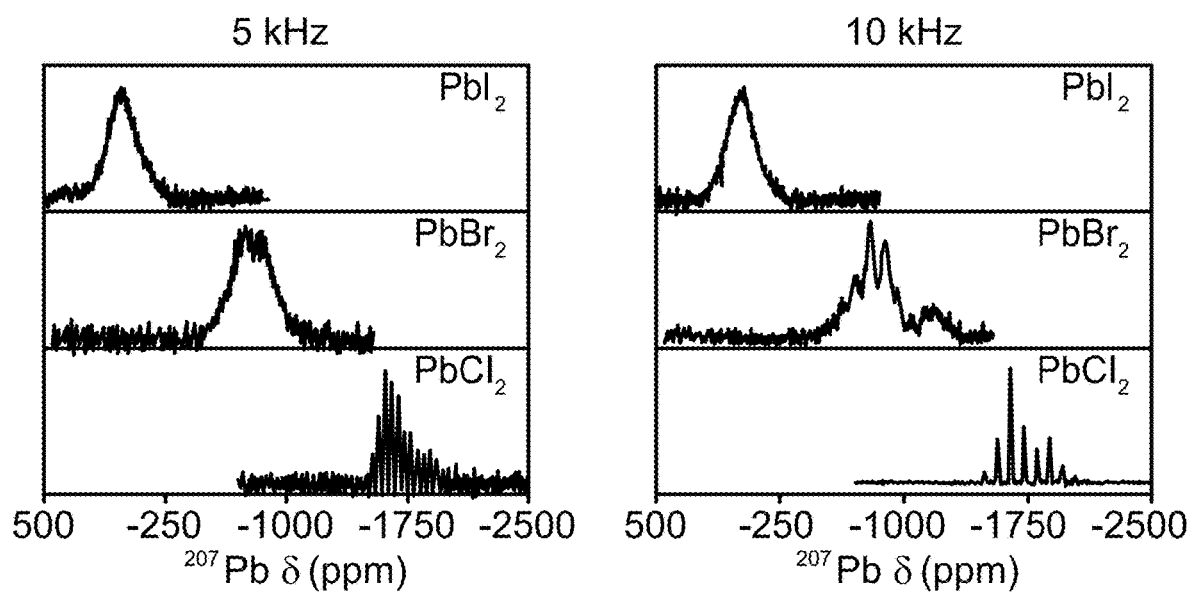
FIGS. 7A and 7B depict $^{207}$Pb ssNMR spectra of $PbX_2$ (X=I, Br, Cl) under 5 kHz (FIG. 7A) and 10 kHz (FIG. 7B) spinning conditions at 22° C.

$^{207}$Pb ssNMR was used to investigate alloying and phase segregation in the lead halides made via solution phase synthesis. As shown in FIG. 5, the $^{207}$Pb ssNMR spectra of the single-halide perovskites show one relatively broad peak. As shown in FIG. 6, the isotropic chemical shift ($\delta_{iso}$) moves progressively upfield (to lower ppm value) as the halogen electronegativity and perovskite band gap increase. Band gap values were estimated by extrapolating the linear slope of Tauc plots for direct band gap semiconductors ((absorbance×excitation energy in eV)$^2$ over excitation energy in eV). This linear correlation is similar to that observed in the lead dihalides (PbX$_2$, X=I, Br, Cl) as shown in FIGS. 1A-1B and 7A-7B. In contrast, the $^{207}$Pb ssNMR spectra of mixed-halide perovskites made by solution phase synthesis exhibit multiple peaks (FIG. 5). For example, the $^{207}$Pb ssNMR spectra of mixed-halide perovskites made by solution phase synthesis with a 1:1 synthetic loading show two peaks each for 'CH$_3$NH$_3$PbI$_{1.5}$Br$_{1.5}$' and 'CH$_3$NH$_3$PbI$_{1.5}$Cl$_{1.5}$', and three peaks for 'CH$_3$NH$_3$PbBr$_{1.5}$Cl$_{1.5}$'.

In order to determine whether the presence of extra $^{207}$Pb peaks is the result of higher order NMR interactions or compositional sample variations, $^{207}$Pb ssNMR spectra were collected with and without sample spinning and at different magnetic fields. For example, the $^{207}$Pb ssNMR spectra of the 'CH$_3$NH$_3$PbBr$_{1.5}$Cl$_{1.5}$' sample collected with a 10 kHz magic angle spinning (MAS) frequency and with a stationary (static) sample spinning are virtually indistinguishable; both show three similar peaks at 160, −117, and −379 ppm as shown in FIGS. 8A-8B. The presence of very broad $^{207}$Pb NMR line widths in all samples, in addition to the lack of narrowing from MAS, is consistent with the $^{207}$Pb ssNMR spectra of other lead-containing semiconductors.

The full width at half-maximum (fwhm) of the $^{207}$Pb resonances is dependent on composition, going from ca. 253 ppm to 33 ppm between pure iodide and pure chloride perovskite, respectively. The $^{207}$Pb ssNMR signal broadening in these systems is likely primarily the result of homogeneous broadening. Additional control experiments using a lower magnetic field of 9.4 T (400 MHz) (as opposed to 16.4 T (600 MHz)) lead to similar $^{207}$Pb ssNMR spectra. Superior resolution was observed at the higher field of 16.4 T, which indicates that the broadening of the $^{207}$Pb ssNMR peaks is primarily homogeneous. This shows that chemical shift anisotropy (CSA) is unlikely to contribute to the observed broadening to a significant extent, because broadening would then increase with applied field.

Longitudinal (T$_1$) and transverse (T$_2$') $^{207}$Pb relaxation time constants were also measured for the single-halides as shown in Table 2, below. Static $^{207}$Pb ssNMR saturation recovery experiments yielded relatively short $^{207}$Pb T$_1$ relaxation times between 1.1 and 1.4 s for all of the single-halide perovskites. Application of MAS lead to a dramatic reduction in the $^{207}$Pb T$_1$'s for both CH$_3$NH$_3$PbI$_3$ (T$_1$≈83 ms) and CH$_3$NH$_3$PbBr$_3$ (T$_1$≈104 ms. For CH$_3$NH$_3$PbI$_3$ and CH$_3$NH$_3$PbBr$_3$, T$_2$'s were short (less than 90 μs) under both MAS and static sample conditions and were nearly equal to T$_2$*, which was calculated from the full width at half-maximum of the $^{207}$Pb ssNMR peaks.

Relaxation measurements directly confirm that the broadening is primarily homogeneous in nature. Both CH$_3$NH$_3$PbI$_3$ and CH$_3$NH$_3$PbBr$_3$ had much shorter transverse relaxation times than CH$_3$NH$_3$PbCl$_3$, which suggests that dipolar/scalar coupling to the halogen nuclei could be responsible for the short transverse relaxation time constants. In summary, these observations indicate that the multiple $^{207}$Pb ssNMR peaks observed for the lead mixed-halide perovskites arise from distinct chemical species or phases that are actually present in each sample, and that the broadening of the different $^{207}$Pb peaks is primarily homogeneous in nature and does not arise from a distribution of isotropic chemical shifts or CSA.

TABLE 2

$^{207}$Pb transverse and longitudinal relaxation time constants for CH$_3$NH$_3$PbX$_3$ (X = I, Br, Cl) at room temperature and a static magnetic field of 9.4 T (400 MHz)$^a$

| | MAS at 50 kHz | | | | Static | | | |
|---|---|---|---|---|---|---|---|---|
| Compound | T$_1$ (ms)$^b$ | T$_2$' (μs)$^c$ | fwhm (kHZ)$^d$ | T$_2$* (μs)$^e$ | T$_1$ (ms) | T$_2$' (μs) | fwhm (kHz) | T$_2$* (μs) |
| CH$_3$NH$_3$PbI$_3$ | 83 | 19 | 21.1 (0.6) | 15 | 1069 | 26 | 25.9 (0.70) | 12 |
| CH$_3$NH$_3$PbBr$_3$ | 104 | 87 | 15.9 (0.91) | 20 | 1538 | 63 | 14.4 (1.0) | 21 |
| CH$_3$NH$_3$PbCl$_3$ | 1657 | 552 | 3.0 (0.37) | 107 | 1385 | 321 | 3.7 (0.75) | 86 |

Figure 9:
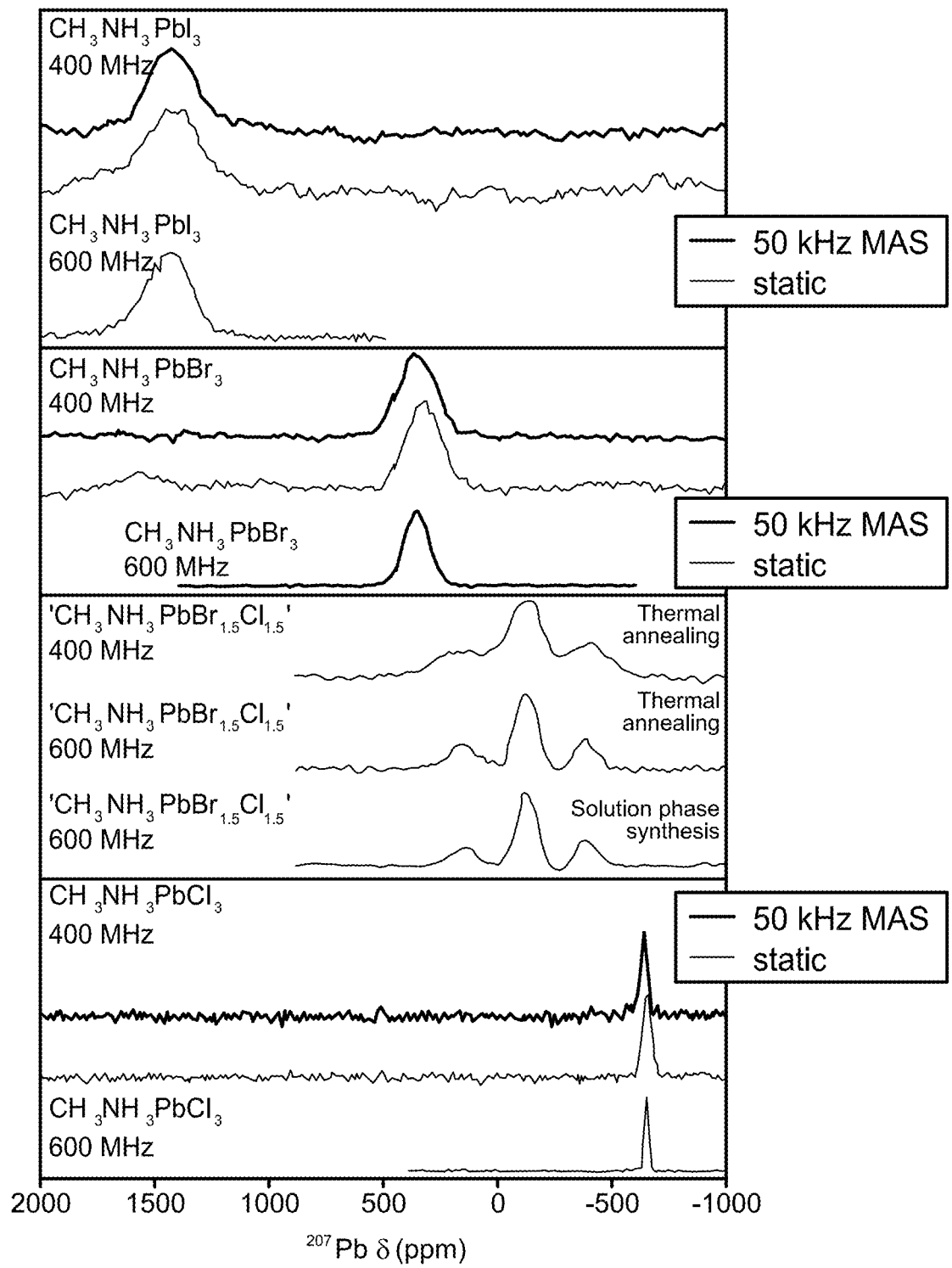
FIG. 9 depicts a comparison of $^{207}$Pb ssNMR spectra collected at different magnetic field strengths (9.4 T, 400 MHz and 16.4 T, 600 MHz) and rotor sample rotation rates (static samples or samples undergoing MAS with a frequency of 50 kHz)

$^a$The corresponding $^{207}$Pb ssNMR spectra are shown in FIG. 9.
$^b$Longitudinal relaxation time constant measured with a saturation recovery experiment.
$^c$Refocused transverse relaxation time constant measured with a spin echo experiment (rotor was synchronized in the case of MAS).
$^d$Full width at half maximum (fwhm), measured by fitting the peak width of the $^{207}$Pb ssNMR spectrum to a mixed Gaussian/Lorentzian function. The Gaussian fraction is given in parentheses.
$^e$Apparent transverse relaxation time constant where T$_2$* = 1/(π × fwhm).

Figure 10A:
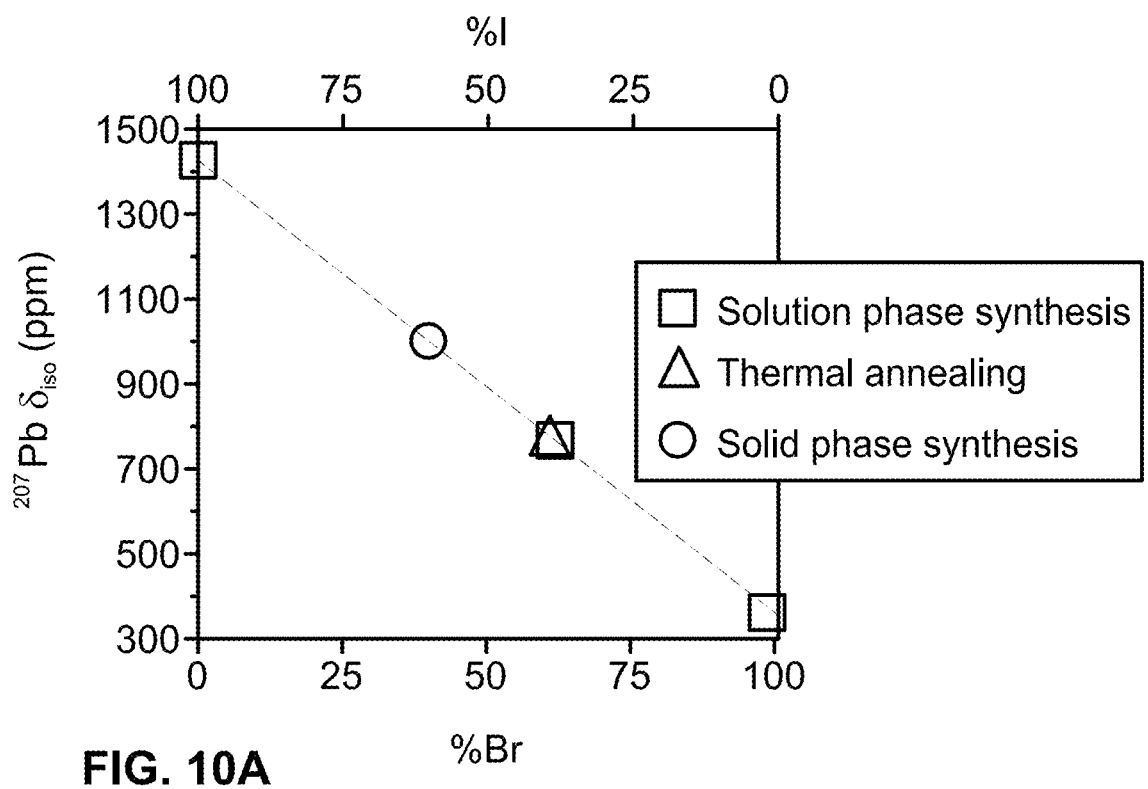
FIGS. 10A and 10B depict $^{207}$Pb ssNMR isotropic chemical shifts ($\delta_{iso}$ at 22° C.) of single- and 1:1 mixed-halide lead perovskites prepared by solution phase synthesis, thermal annealing, and solid phase synthesis as a function of halide composition.
Figure 10B:
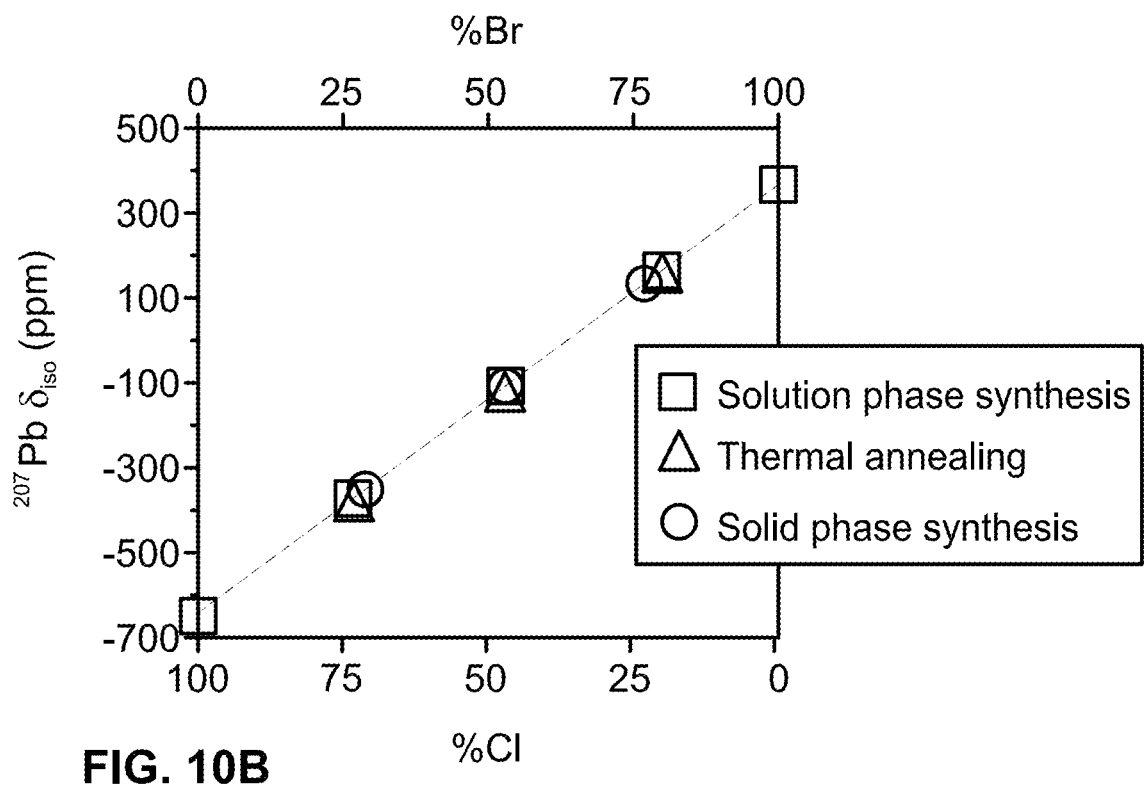

To explain the spectroscopic observations, each of the aforementioned '1:1' mixed-halide perovskites is considered. Because δ$_{iso}$ varies linearly with average electronegativity and band gap (FIG. 6), these values were used to estimate the chemical compositions of all observed $^{207}$Pb resonances from a calibration curve determined from the single-halide perovskites (FIGS. 10A-10B).

'CH$_3$NH$_3$PbI$_{1.5}$Br$_{1.5}$' prepared by solution phase synthesis has a single set of powder XRD peaks, indicating a single crystalline phase is present (FIG. 3A); however, this sample has two resolved $^{207}$Pb ssNMR peaks located at 774 and 361 ppm (see Table 3, below, and FIG. 5). The first NMR peak located at 774 ppm is in between the pure (single-halide) iodide and bromide perovskites, but closer to the latter (FIG. 10A); based on its chemical shift, the inventors attribute this resonance to the crystalline, bromide-rich perovskite CH$_3$NH$_3$PbIBr$_2$ (Table 3, below). This assignment is consistent with both the optical and XRD data for this sample (see FIGS. 2B and 3A). The chemical shift of the second resonance at 361 ppm is identical to that of the pure bromide perovskite (FIGS. 5 and 10A).

Figure 11A:
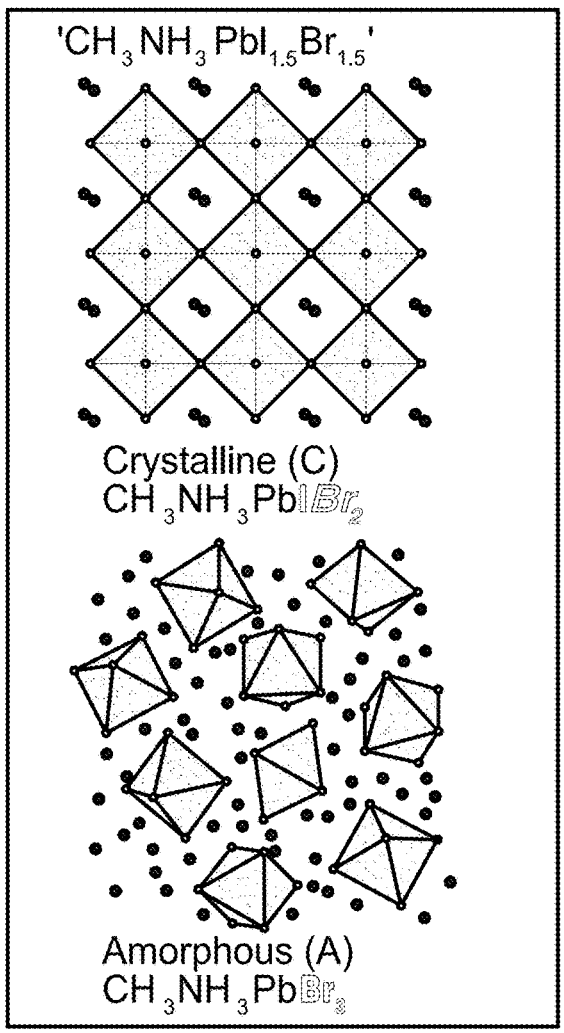
FIGS. 11A-11D schematically depict possible compositional assignments for the mixed halide perovskites '$CH_3NH_3PbI_{1.5}Br_{1.5}$' (FIG. 11A or FIG. 11B), '$CH_3NH_3PbBr_{1.5}Cl_{1.5}$' (FIG. 11C), and '$CH_3NH_3PbI_{1.5}Cl_{1.5}$' (FIG. 11D) made by solution phase synthesis and thermal annealing.
Figure 11B:
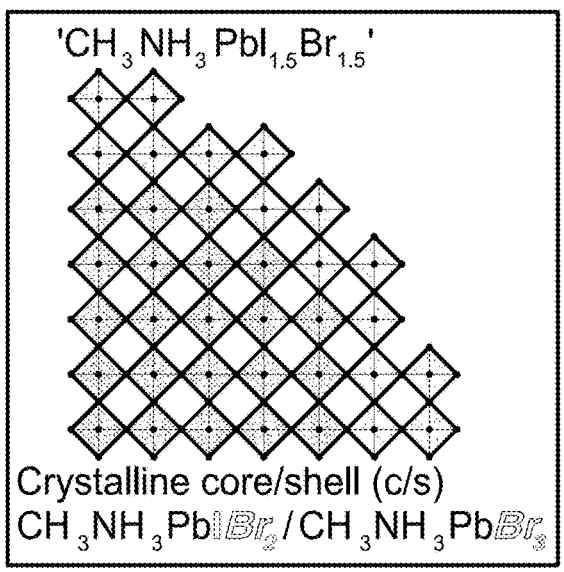

However, this phase is absent from XRD and steady state optical measurements, which means that there could be two different, alternative assignments for it: (i) One possibility is the presence of amorphous, uncrystallized CH$_3$NH$_3$PbBr$_3$ (as depicted schematically in FIG. 11A); (ii) Another possibility is that the whole sample consists of core/shell nanocrystals made of $CH_3NH_3PbIBr_2$ cores surrounded by thin, semicrystalline $CH_3NH_3PbBr_3$ shells (as depicted schematically in FIG. 11B). As in other similar nanostructures, thin $CH_3NH_3PbBr_3$ shells would be hard to distinguish by XRD because they would diffract weakly. In addition, in a core/shell configuration, the $CH_3NH_3PbBr_3$—lattice would likely expand to better epitaxially fit onto the iodide-containing $CH_3NH_3PbIBr_2$ core.

However, quick and facile halide diffusion may argue against the presence of core/shells (see below). A comparison of relative peak areas suggests that the ratio between the crystalline (C) $CH_3NH_3PbIBr_2$ and semicrystalline (A or/s) $CH_3NH_3PbBr_3$ phases present in this particular sample is 26% to 74% (Table 3).

A possible explanation for phase segregation during the solution phase synthesis of '$CH_3NH_3PbI_{1.5}Br_{1.5}$' is the loss of iodide precursors to the supernatant. ICP-MS and titration analyses of '$CH_3NH_3PbI_{1.5}Br_{1.5}$' samples made by this method suggest a somewhat variable and batch dependent bromide-rich composition with an I:Br ratio between 28:72 and 19:81. ICP-MS data were collected on a Thermo Scientific Element 1 ICP-MS instrument Elemental Scientific, Inc. PFA-100 low-flow nebulizer. 10-15 mg of sample was dissolved in 70% nitric acid and then diluted to approximately 5 ppm with a 1% nitric acid in deionized water solution. Titration data were collected by Galbraith Laboratories, Inc. ICP-MS analysis of two supernatants from two separate batches suggest that iodide is present at 2.7 and 4.1 wt %, with no bromide detected in either sample. This is consistent with the presence of the I—Br miscibility gap in this system below 70° C.

'$CH_3NH_3PbBr_{1.5}Cl_{1.5}$' made by solution phase synthesis also shows a single set of XRD peaks indicating the presence of a single, crystalline phase (FIG. 3A). However, '$CH_3NH_3PbBr_{1.5}Cl_{1.5}$' shows three $^{207}Pb$ ssNMR peaks located at 160 ppm, −117 ppm, and −379 ppm in a ca. 1:2:1 ratio (Table 3 and FIG. 5). The most intense, center resonance at −117 ppm is halfway between pure bromide and chloride perovskites (FIG. 10B); based on its chemical shift, and in agreement with optical and XRD data, we attribute it to crystalline $CH_3NH_3PbBr_{1.5}Cl_{1.5}$ (Table 3). The other two side resonances are nearly equidistant from the center resonance; based on their relative chemical shifts, they could be assigned as $CH_3NH_3PbBr_{2.25}Cl_{0.75}$ (160 ppm) and $CH_3NH_3PbBr_{0.75}Cl_{2.25}$ (−379 ppm) (Table 3 and FIG. 10B).

These assignments correspond to individual lead coordination environments comprised of $[PbBr_5Cl]^{4-}$ or $[PbBr_4Cl_2]^{4-}$ octahedra and $[PbBrCl_5]^{4-}$ or $[PbBr_2Cl_4]^{4-}$ octahedra, respectively; because the $^{207}Pb$ ssNMR peaks are broad, it is difficult to definitely distinguish between each of these pairs of individual assignments. These nonstoichiometric bromide- and chloride-rich octahedra could be present either as amorphous, uncrystallized impurities or as dopant sites within the main $CH_3NH_3PbBr_{1.5}Cl_{1.5}$ crystalline phase; because of their very similar peak intensities relative to each other (160 ppm, 21%; −379 ppm, 23%), yet significantly smaller than that of the main crystalline phase (−117 ppm, 56%), they likely exist as dopants (as depicted schematically in FIG. 11C). Such isolated Br- and Cl-rich sites would not only be difficult to resolve by XRD, but variations in the Pb—X bond lengths caused by lattice-enforced compression (for example, in $[PbBr_5Cl]^{4-}$) or elongation (for example, in $[PbBrCl_5]^{4-}$) could also shift the $^{207}Pb$ resonances farther upfield and downfield, respectively, from where they could be expected based on composition alone.

A possible explanation for these observations is the presence of spinodal decomposition of the stoichiometric Br—Cl perovskite, a well-known phenomenon where the main crystalline phase coexists in equilibrium with a finite amount of nonstoichiometric domains.

Figure 11C:
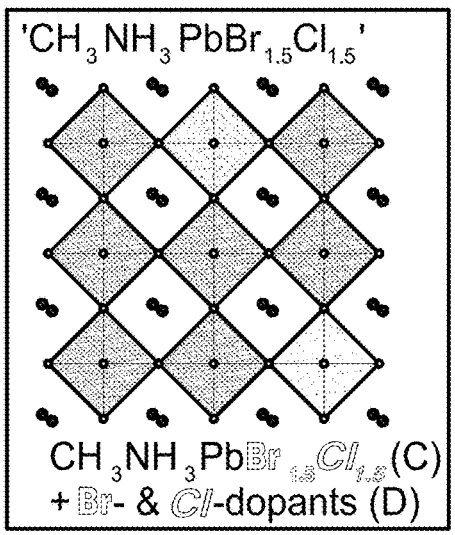
Figure 11D:
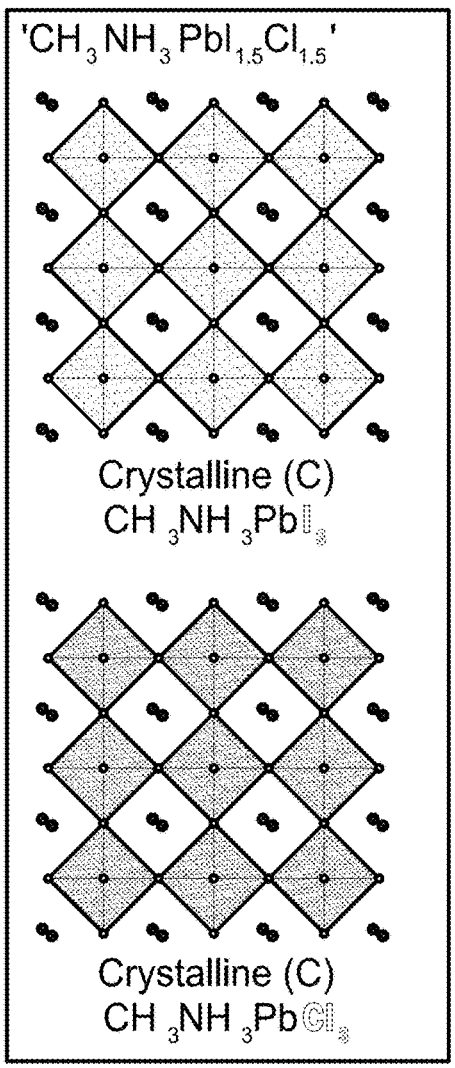
Figure 12A:
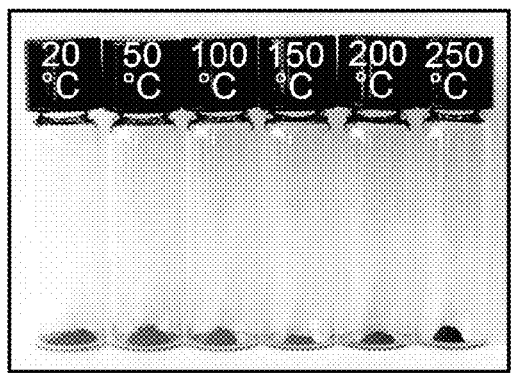
FIGS. 12A-12E depict a visual image (FIG. 12A), diffuse reflectance (FIG. 12B), Tauc plot (FIG. 12C), band gap (FIG. 12D), and powder XRD data (FIG. 12E) for '$CH_3NH_3PbI_{1.5}Br_{1.5}$' made by thermal annealing to different temperatures (annealing to 250° C. results in partial decomposition to PbIBr)
Figure 12B:
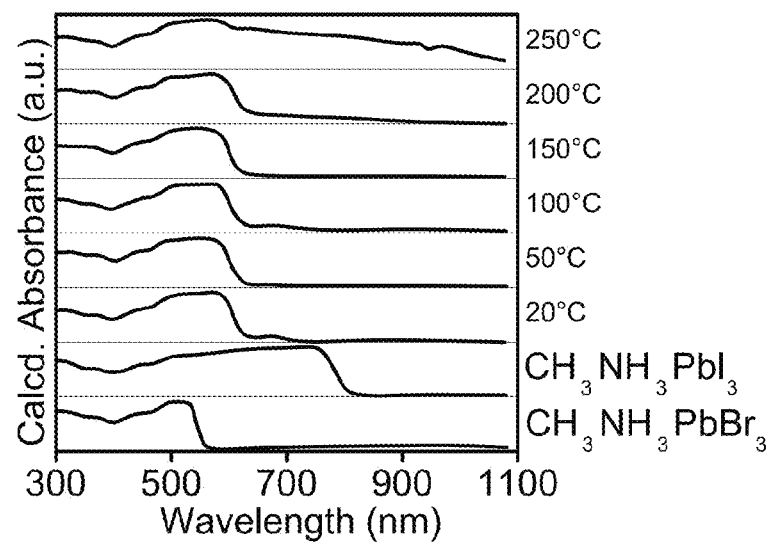
Figure 12C:
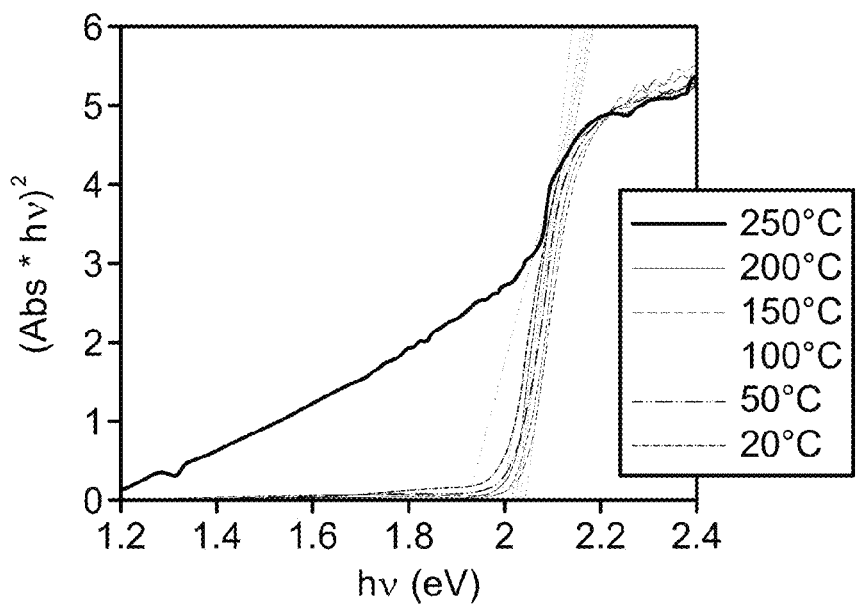
Figures 12D, 12E:
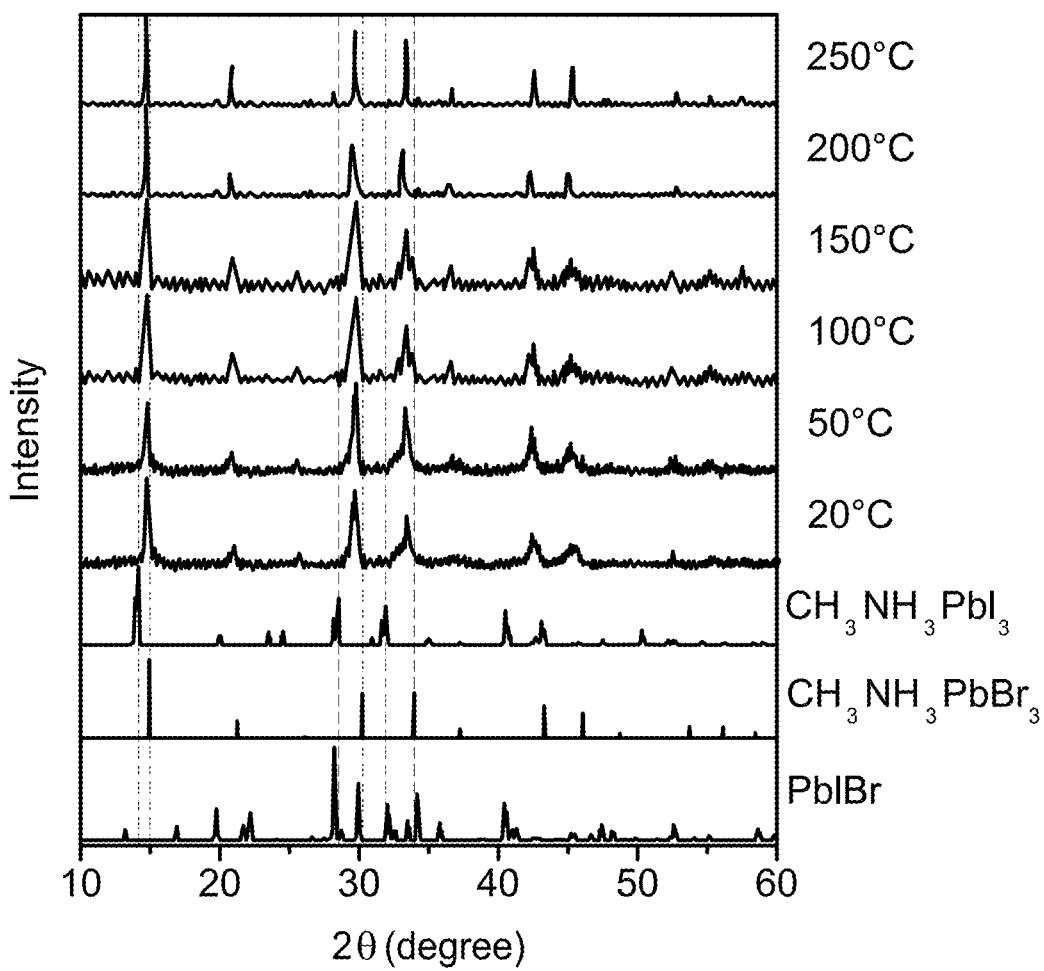
Figure 13A:
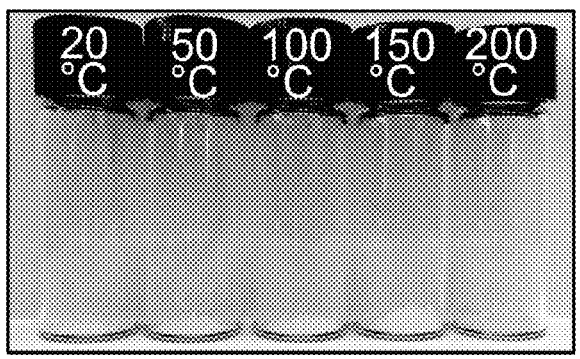
FIGS. 13A-13E a visual image (FIG. 13A), diffuse reflectance (FIG. 13B), Tauc plot (FIG. 13C), band gap (FIG. 13D), and powder XRD data (FIG. 13E) for '$CH_3NH_3PbBr_{1.5}Cl_{1.5}$' made by thermal annealing to different temperatures.
Figure 13B:
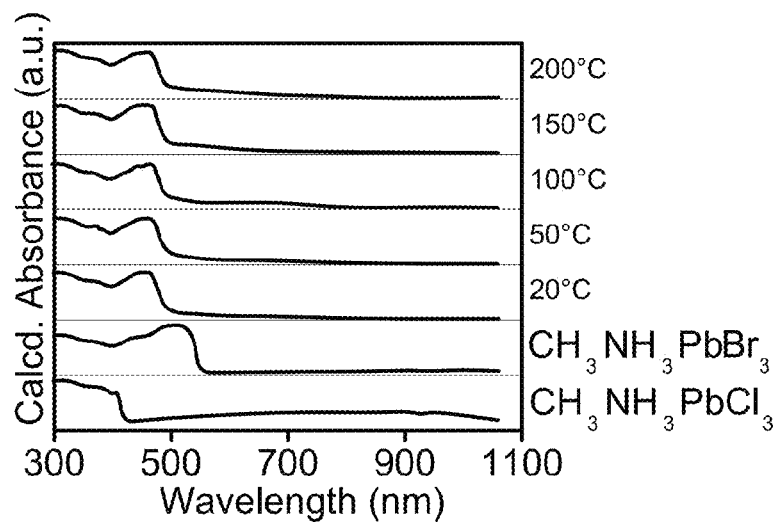
Figure 13C:
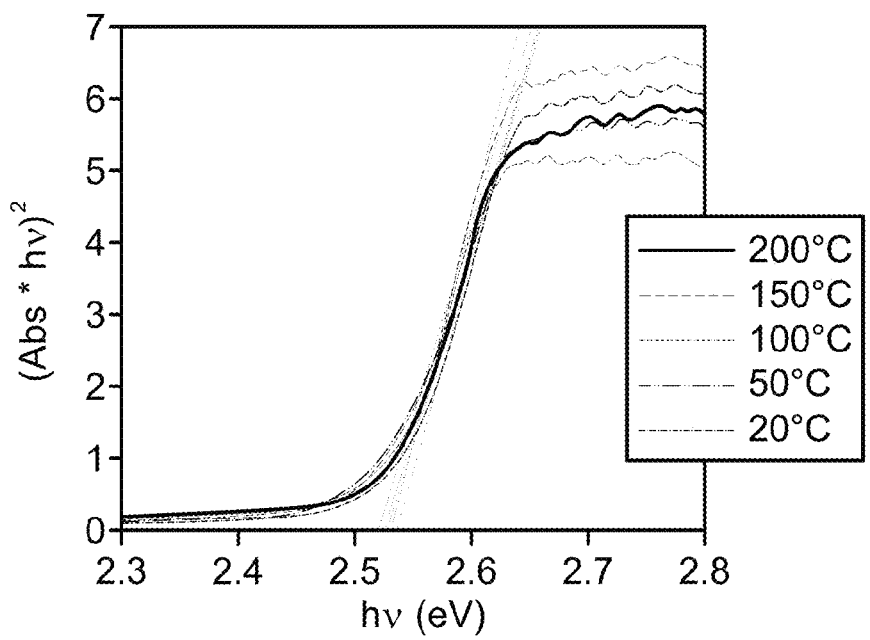
Figures 13D, 13E:
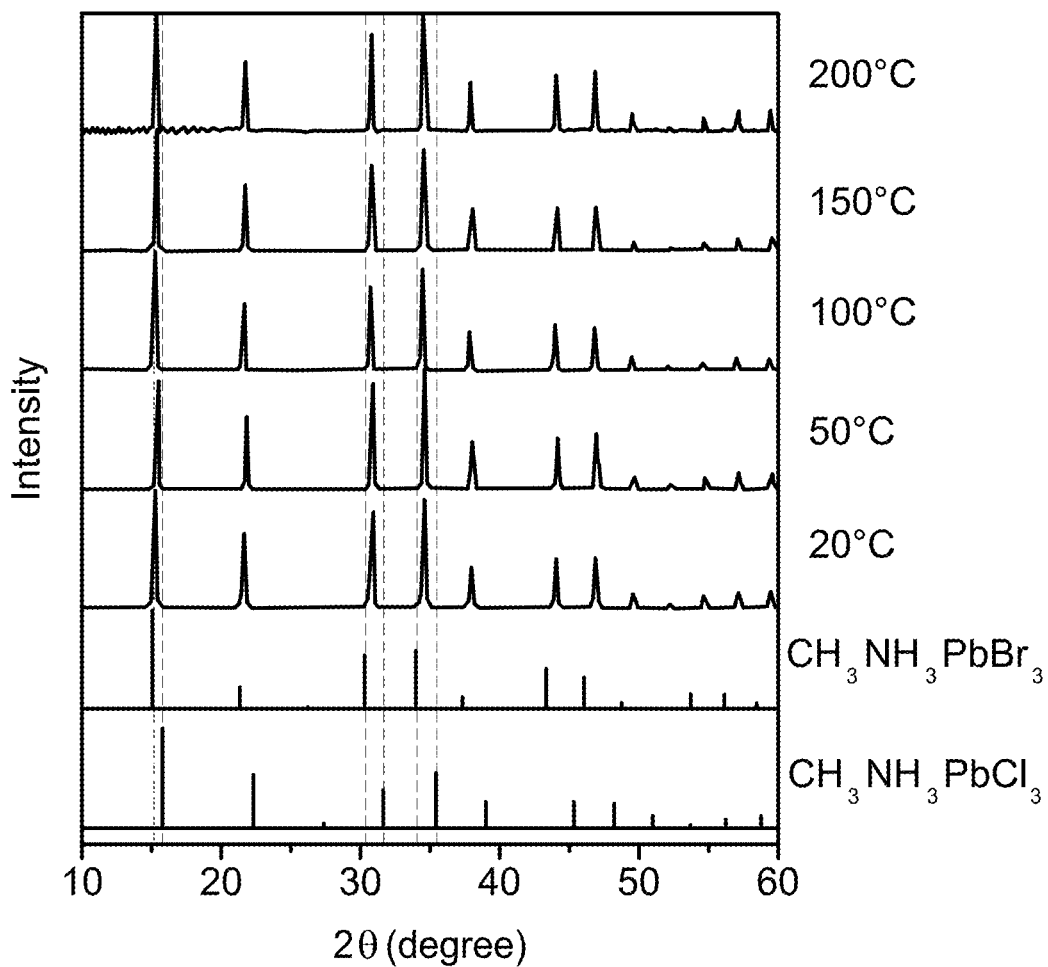

Finally, '$CH_3NH_3PbI_{1.5}Cl_{1.5}$' displays two distinct, independent sets of XRD peaks along with two major $^{207}Pb$ ssNMR peaks, the latter located at 1427 ppm and −647 ppm (FIGS. 3A and 5); these data are consistent with phase segregated, crystalline $CH_3NH_3PbI_3$ and $CH_3NH_3PbCl_3$, respectively, as expected from simple crystallographic considerations (Table 2 and FIG. 11D).

TABLE 3

$^{207}Pb$ ssNMR Data and Proposed Compositional Assignments for Organolead Halide Perovskites

| Synthetic loading | $\delta_{iso}$ (ppm) | Compositional Assignment(s) | Phase (%) |
|---|---|---|---|
| Solution phase synthesis | | | |
| '$CH_3NH_3PbI_3$' | 1423 | $CH_3NH_3PbI_3$ | C (100) |
| '$CH_3NH_3PbI1.5Br1.5$' | 774 | $CH_3NH_3PbIBr_2$ | C (26) |
| | 361 | $CH_3NH_3PbBr_3$ | A or/s (74) |
| '$CH_3NH_3PbBr_3$' | 361 | $CH_3NH_3PbBr_3$ | C (100) |
| '$CH_3NH_3PbBr_{1.5}Cl_{1.5}$' | 160 | $CH_3NH_3PbBr_{2.25}Cl_{0.75}$ | D (21) |
| | −117 | $CH_3NH_3PbBr_{1.5}Cl_{1.5}$ | C (56) |
| | −379 | $CH_3NH_3PbBr_{0.75}Cl_{2.25}$ | D (23) |
| '$CH_3NH_3PbCl_3$' | −648 | $CH_3NH_3PbCl_3$ | C (100) |
| $CH_3NH_3PbI_{1.5}Cl_{1.5}$ | 1427 | $CH_3NH_3PbI_3$ | C (n.d.) |
| | −647 | $CH_3NH_3PbCl_3$ | C (n.d.) |
| Thermal annealing | | | |
| '$CH_3NH_3PbI_{1.5}Br_{1.5}$' | 778 | $CH_3NH_3PbBr_2$ | C (53) |
| | 343 | $CH_3NH_3PbBr_3$ | A or/s (47) |
| '$CH_3NH_3PbBr_{1.5}Cl_{1.5}$' | 166 | $CH_3NH_3PbBr_{2.25}Cl_{0.75}$ | D (24) |
| | −109 | $CH_3NH_3PbBr_{1.5}Cl_{1.5}$ | C (55) |
| | −375 | $CH_3NH_3PbBr_{0.75}Cl_{2.25}$ | D (21) |
| Solid phase synthesis | | | |
| '$CH_3NH_3PbI_{1.5}Br_{1.5}$' | 1126 | $CH_3NH_3PbI_{2.1}Br_{0.9}$ | D (30) |
| | 997 | $CH_3NH_3PbI_{1.8}Br_{1.2}$ | C (40) |
| | 872 | $CH_3NH_3PbI_{1.5}Br_{1.5}$ | D (30) |
| '$CH_3NH_3PbBr_{1.5}Cl_{1.5}$' | 135 | $CH_3NH_3PbBr_{2.25}Cl_{0.75}$ | D (23) |
| | −112 | $CH_3NH_3PbBr_{1.5}Cl_{1.5}$ | C (62) |
| | −358 | $CH_3NH_3PbBr_{0.75}Cl_{2.25}$ | D(15) |

A possible explanation for the presence of dopants and amorphous phases in lead halide perovskites relates to their ability to crystallize under specific synthetic conditions. The materials initially mentioned above were synthesized at room temperature by precipitation from solution according to Equation 1, above. To probe this issue, freshly made mixed-halide perovskites were thermally annealed. In particular, mixed-halide perovskites prepared by solution phase synthesis were subjected to annealing between 50 and 250° C. in 50° C. increments for 1 hour each. As shown in FIGS. 12A-12E, and 13A-13E, neither '$CH_3NH_3PbI_{1.5}Br_{1.5}$' nor '$CH_3NH_3PbBr_{1.5}Cl_{1.5}$' shows a significant change in color or crystal structure between 20 and 200° C., above which both materials start showing signs of thermal decomposition ($T_{dec}$ onset≥250° C.). In the case of '$CH_3NH_3PbI_{1.5}Br_{1.5}$', the individual powder XRD peaks become sharper upon annealing (FIG. 12E), indicating an increase in single crystalline domain (Scherrer) size from 36±12 nm at 20° C. to 68±10 nm at 200° C.

Critically, $^{207}Pb$ ssNMR reveals that the composition of the different phases present in lead mixed-halide perovskites made by solution phase synthesis remains roughly the same after thermal annealing up to 200° C. The '$CH_3NH_3PbI_{1.5}Br_{1.5}$' sample retains two resonances at 778 and 343 ppm (Table 3 and FIG. 5), strongly indicating that both crystalline $CH_3NH_3PbIBr_2$ and semicrystalline $CH_3NH_3PbBr_3$, respectively, survive and are still present after annealing (Table 3 and FIG. 10A). Increased iodide incorporation during the initial solution phase synthesis of the '$CH_3NH_3PbI1.5Br1.5$' sample that was subjected to thermal annealing may explain the change in relative intensities between the 778 and 343 ppm peaks. This idea is supported by the variable iodide wt % values measured by ICP-MS for different supernatants. Likewise, the '$CH_3NH_3PbBr_{1.5}Cl_{1.5}$' sample retains three resonances at 166 ppm, −109 ppm, and −375 ppm with a 1:2:1 relative integration, which is almost identical to the sample before annealing (FIG. 5 and FIG. 10B). These data strongly support the idea that the nonstoichiometric $CH_3NH_3PbBr_{2.25}Cl_{0.75}$ (166 ppm) and $CH_3NH_3PbBr_{1.75}Cl_{2.25}$ (−375 ppm) dopants likely form by spinodal decomposition and are persistent alongside the main stoichiometric phase $CH_3NH_3PbBr_{1.5}Cl_{1.5}$ (−109 ppm) after annealing.

Having observed that semicrystalline, phase segregated phases and dopants can coexist and survive after thermal annealing, the question remained whether the persistence of such domains could be related to the ability of halide ions to diffuse from one solid phase to another. To probe this question, mixed-halide perovskites were synthesized by the presently disclosed solid state synthesis that involves mixing premade, solid, single-halide perovskites and subjecting them to heat as shown schematically in Equation 2, below, where X, X'=I, Br, Cl; 3>a>0. In particular, a stoichiometrically desired mixture of the parent, single-halide perovskites was subjected to heating between 50 and 200° C. with 50° C. increments for 1 hour each.

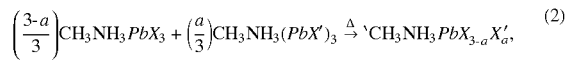

$$\left(\frac{3-a}{3}\right)CH_3NH_3PbX_3 + \left(\frac{a}{3}\right)CH_3NH_3(PbX')_3 \xrightarrow{\Delta} \text{`}CH_3NH_3PbX_{3-a}X'_a\text{'} \quad (2)$$

Figure 14A:
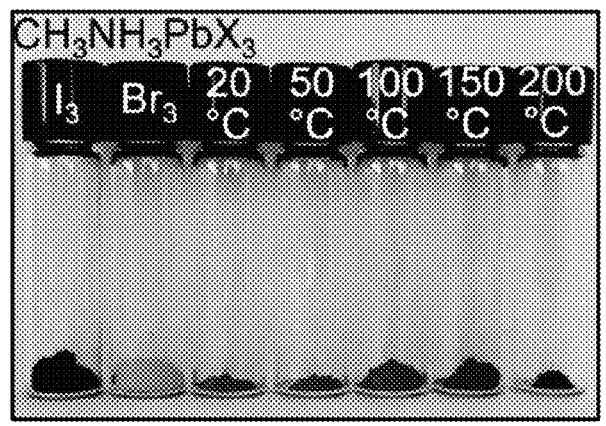
FIGS. 14A-14C depict a visual image (FIG. 14A), Tauc plot (FIG. 14B), and powder XRD patterns (FIG. 14C) for '$CH_3NH_3PbI_{1.5}Br_{1.5}$' made by solid phase synthesis starting from an equimolar mixture of $CH_3NH_3PbI_3$ and $CH_3NH_3PbBr_3$.
Figure 14B:
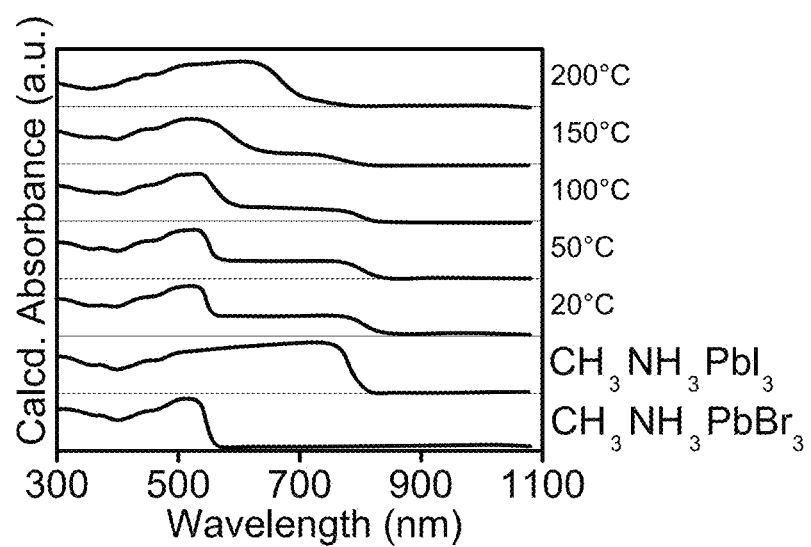
Figure 14C:
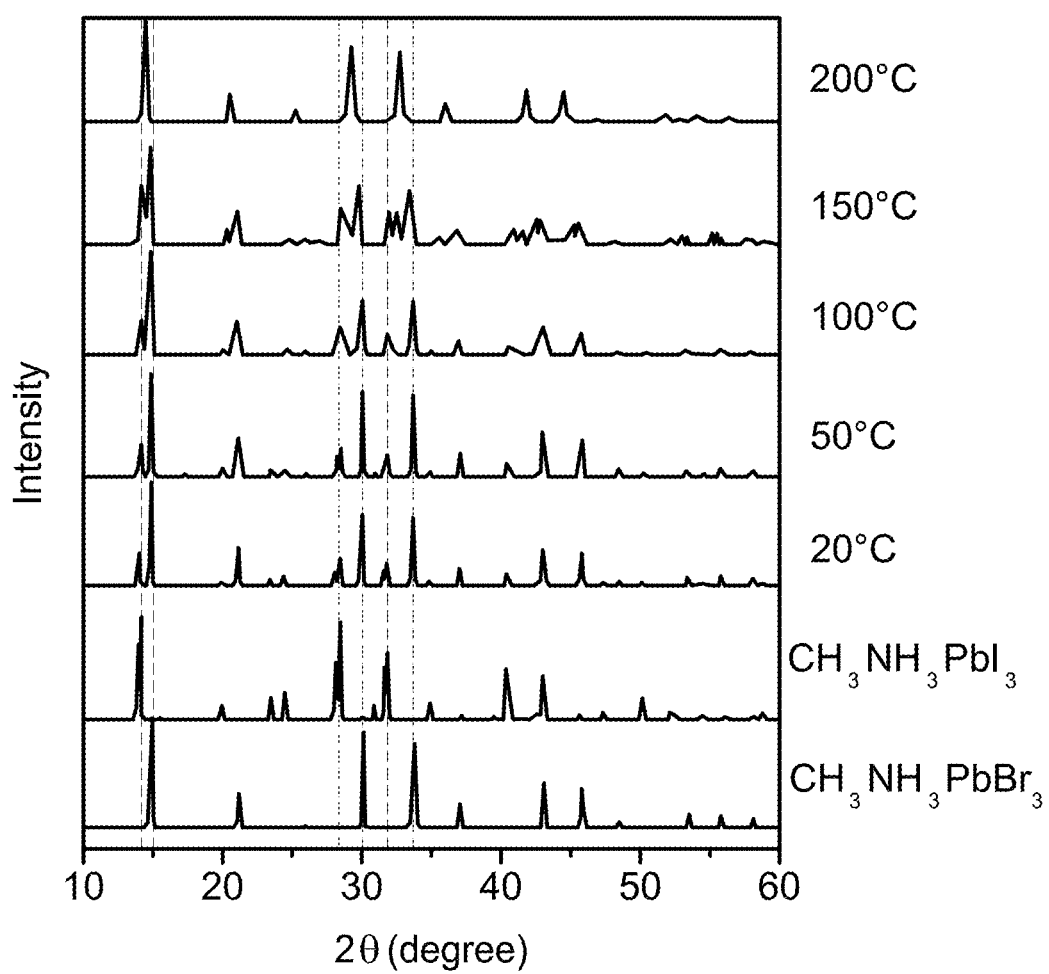
Figure 15A:
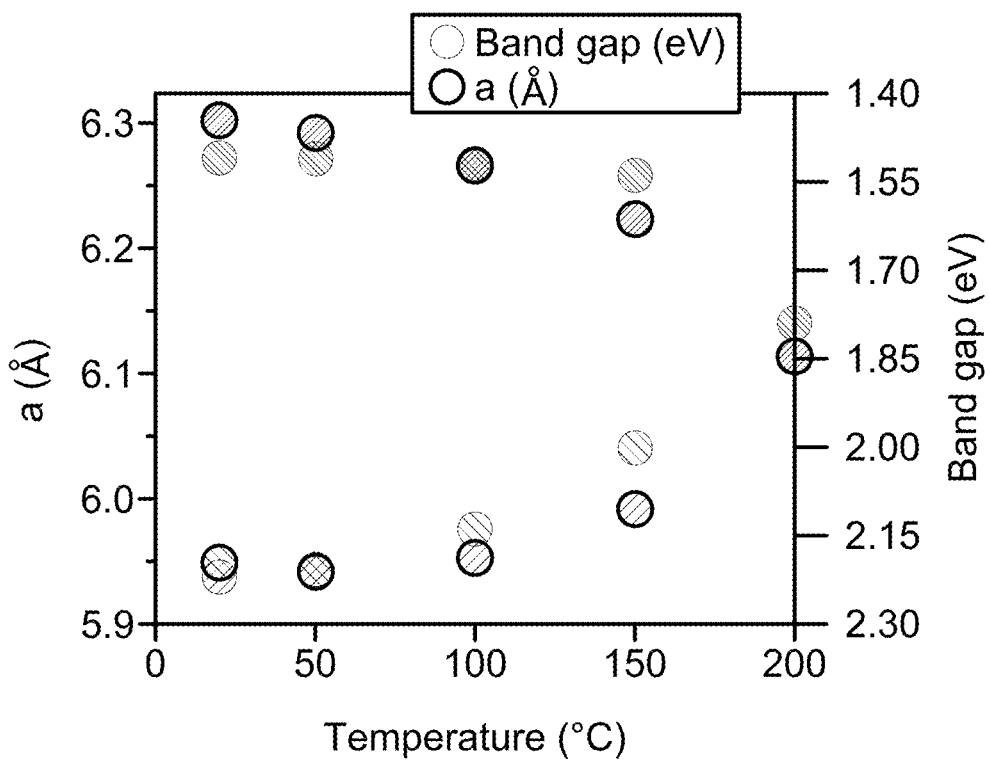
FIGS. 15A and 15B depict the effect of annealing temperature on the lattice parameter and band gap (FIG. 15A) and single crystalline (Scherrer) domain size (FIG. 15B) measured by XRD during the solid phase synthesis of '$CH_3NH_3PbI_{1.5}Br_{1.5}$' starting from a near equimolar mixture of $CH_3NH_3PbI_3$ (solid circles) and $CH_3NH_3PbBr_3$ (open circles)

As shown in FIG. 14A, an equimolar (1:1) solid mixture of $CH_3NH_3PbI_3$ and $CH_3NH_3PbBr_3$ changes color from brown-orange at 20° C. to black after heating to 200° C. The absorption edges of the two starting materials, initially present at 20° C. begin to move closer together and coalesce upon heating; a single absorption edge located roughly halfway between the two parent, single-halide perovskites is observed after heating to 200° C. (FIGS. 14B and 15A). Similarly, the two initial sets of XRD peaks corresponding to the two parent, single-halide perovskites move closer together and coalesce into a single set of XRD peaks after heating from 20 to 200° C. (FIGS. 14C and 15A). Together, these data are consistent with the formation of '$CH_3NH_3PbI_{1.5}Br_{1.5}$' in the solid state.

Figure 15B:
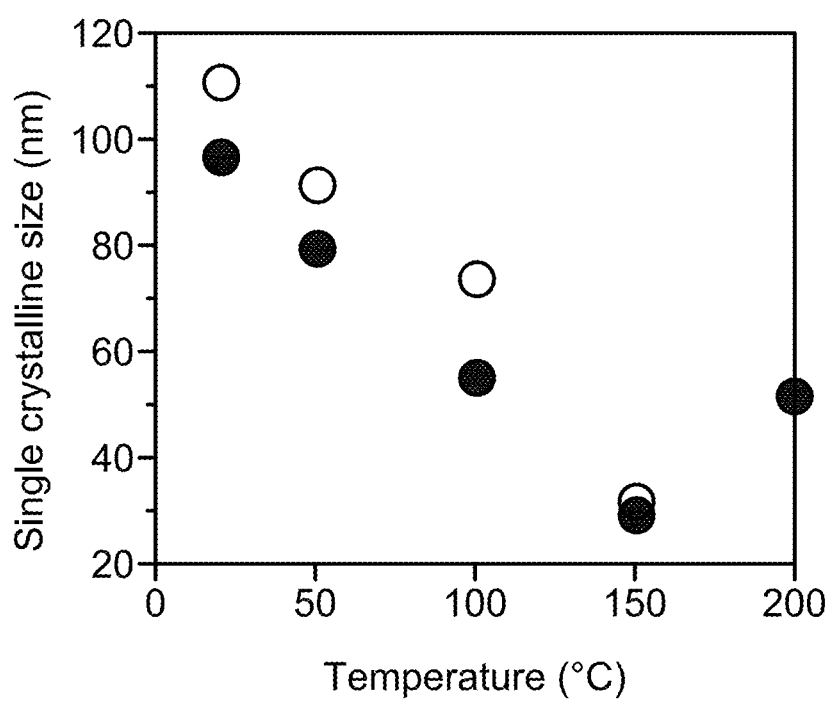

A closer examination of XRD data during the solid phase synthesis of '$CH_3NH_3PbI_{1.5}Br_{1.5}$' reveals that heating from 20 to 150° C. causes an initial decrease in the average single crystalline domain (Scherrer) sizes of the iodide-rich phase from 96±19 nm to 29±9 nm and of the bromide-rich phase from 110±13 nm to 32±10 nm (FIG. 15B, solid and open circles, respectively). At this point, there is an inflection point after the two sets of peaks merge; further heating from 150 to 200° C. causes a slight increase in Scherrer size of the mixed-halide phase to 52±9 nm (FIG. 15B). These two distinct particle size regimes can be attributed to interfacial nucleation (via halide diffusion/exchange) and growth (via coalescence) of the new mixed-halide phase.

A very similar behavior is observed by optical spectroscopy and powder XRD during the solid state synthesis of '$CH_3NH_3PbBr_{1.5}Cl_{1.5}$' starting from an equimolar mixture of $CH_3NH_3PbBr_3$ and $CH_3NH_3PbCl_3$ solid. In this case, the inflection point between decreasing (nucleation) and increasing (growth) single average crystalline domain sizes is slightly lower than in the previous case, at ca. 100-150° C. In both cases, simultaneous differential thermal-thermogravimetric analyses (DTA-TGA) showed that these solid phase reactions are accompanied by broad or "shallow" endothermic transitions with no measurable mass loss. DTA-TGA measurements were collected using a TA Instruments SDT 2960. After purging with $N_2$ gas, 15 mg per sample was subjected to two heating-cooling cycles at 20° C./min up to 200° C., followed by cooling to 60° C. with a fan. A comparison of XRD and scanning electron microscopy (SEM) data showed that the mixed-halide perovskites produced in this way consist of heavily twinned particles of comparable size and morphology to those of the parent, single-halide perovskites (FIGS. 4A-4E).

Critically, the $^{207}Pb$ ssNMR spectrum of '$CH_3NH_3PbI_{1.5}Br_{1.5}$' prepared by solid phase synthesis shows not two, but one single broad resonance at 997 ppm (Table 3 and FIG. 5). Interestingly, this peak is significantly broader (fwhm=410 ppm) than those of the parent $CH_3NH_3PbI_3$ and $CH_3NH_3PbBr_3$ perovskites (fwhm=253 and 150 ppm, respectively) (see FIG. 5); this suggests that this peak is made of multiple overlapping resonances likely corresponding to a range of different local lead environments within a single phase. These sites are likely nonstoichiometric I- and Br-rich dopants similar to those found in '$CH_3NH_3PbBr_{1.5}Cl_{1.5}$' as discussed above. Deconvolution of the broad resonance at 997 ppm into three peaks suggests that the '$CH_3NH_3PbI_{1.5}Br_{1.5}$' sample produced by solid phase synthesis is actually composed of $CH_3NH_3PbI_{2.1}Br_{0.9}$ (1126 ppm, 30%), $CH_3NH_3PbI_{1.8}Br_{1.2}$ (997 ppm, 40%), and $CH_3NH_3PbI_{1.5}Br_{1.5}$ (872 ppm, 30%) (Table 3 and FIG. 5). Experimental uncertainties associated with weighing equimolar amounts of starting materials may account for the $CH_3NH_3PbI_{1.8}Br_{1.2}$ crystalline product being slightly off the 1:1 halide ratio expected from loading alone.

Thus, in contrast to solution phase synthesis, no semicrystalline $CH_3NH_3PbBr_3$ is observed in '$CH_3NH_3PbI_{1.5}Br_{1.5}$' made by solid phase synthesis. This suggests that the specific synthetic procedure has a large impact on the composition and purity of the resulting mixed iodo-bromide lead perovskites. In contrast to solution phase synthesis, which is carried out at 20° C., our solid phase synthesis is carried out at 200° C., well above the maximum point of the miscibility dome proposed in the recently calculated I—Br phase diagram. In addition, our solid phase synthesis requires no solvent(s) so that no single precursor or major component is lost during sample isolation and purification.

In contrast to '$CH_3NH_3PbI_{1.5}Br_{1.5}$', the $^{207}Pb$ ssNMR spectrum of '$CH_3NH_3PbBr_{1.5}Cl_{1.5}$' prepared by solid phase synthesis still shows three $^{207}Pb$ ssNMR peaks that are very similar to those observed when the sample is prepared by either solution phase synthesis or thermal annealing methods (FIG. 5). Based on the specific chemical shifts, we assign these resonances as $CH_3NH_3PbBr_{2.25}Cl_{0.75}$ (135 ppm, 23%), $CH_3NH_3PbBr_{1.5}Cl_{1.5}$ (−112 ppm, 62%), and $CH_3NH_3PbBr_{0.75}Cl_{2.25}$ (−358 ppm, 15%) (Table 3). Because three similar resonances are present in the $^{207}Pb$ ssNMR spectra of all the '$CH_3NH_3PbBr_{1.5}Cl_{1.5}$' samples studied, in can be concluded that the nonstoichiometric dopants form spontaneously as a result of spinodal decomposition (FIG. 11C). These dopant sites or impurities are always naturally present and are persistent regardless of which specific synthetic method is used.

In summary, a combination of optical absorption spectroscopy, powder XRD, and, $^{207}$Pb ssNMR spectroscopy were used to investigate phase segregation and alloying in lead mixed-halide perovskites. While crystallography alone accounts for phase segregation between $CH_3NH_3PbI_3$ and $CH_3NH_3PbCl_3$, it does not explain the true microstructure and extent of alloying between $CH_3NH_3PbI_3$ and $CH_3NH_3PbBr_3$, or between $CH_3NH_3PbBr_3$ and $CH_3NH_3PbCl_3$.

Compositional assignment of multiple resonances observed in the $^{207}$Pb ssNMR spectra of mixed-halide perovskites unveiled the presence of nonstoichiometric impurities or "dopants", as well as of semicrystalline (amorphous or nanostructured core/shell) phases, which accompany the main stoichiometric crystalline phase. While dopants are prevalent and persistent regardless of the synthesis method, semicrystalline phases can form when samples are made by room temperature solution phase synthesis or their thermal annealing. However, semicrystalline phases do not form when lead, mixed-halide perovskite compounds are synthesized using high temperature solid phase synthesis.

The thermal annealing experiments showed that the presence of dopants and semicrystalline phases is not related to the ability of lead mixed-halide perovskites to crystallize under specific synthetic conditions. Further, solid phase synthesis experiments showed that ion diffusion is not a barrier to alloying in lead halide perovskites. The formation of nonstoichiometric dopants is consistent with partial phase segregation caused by spinodal decomposition, which results in small composition fluctuations throughout the entire lattice that differ from the desired stoichiometric phase. In other words, these materials are composed of a main stoichiometric, alloyed phase that exists in equilibrium with two nonstoichiometric, halide-rich phases at room temperature.

Combined with other more commonly used optical absorption spectroscopy and X-ray diffraction methods, $^{207}$Pb ssNMR offers unique opportunities to understand how various synthetic procedures affect the true composition, speciation, stability (against moisture, heat, light), and optoelectronic properties of these materials. Further enhancements in the efficiency and performance of perovskite-based photovoltaics and other energy conversion devices may thus be achieved through careful synthetic manipulation of such impurity phases and nanodomains.

Specifically, $CH_3NH_3PbI_3$ and $CH_3NH_3PbBr_3$ precursor solutions were made by dissolving $PbI_2$ (155 mg) and $CH_3NH_3I$ (53.4 mg) in γ-butyrolactone (3 mL) or by dissolving $PbBr_2$ (200 mg) and $CH_3NH_3Br$ (61 mg) in N,N-dimethylformamide (2 mL), respectively. Each single halide perovskite was precipitated as a powder by diluting each precursor solution to 50 mL with toluene. Approximately 100 mg of each perovskite was added to a separate 6 mL scintillation vial with 0.15 mL toluene followed by stirring to form a thick paste. Four to five drops of each perovskite paste was added to separate pieces of Kapton polyimide tape of 19 mm (0.75") width from a Pasteur pipette to form a sample spot size of 7 mm×7 mm (0.25"×0.25") as shown in FIGS. 16A and 16B, which depict $CH_3NH_3PbI_3$ powder and $CH_3NH_3PbBr_3$ powder, respectively. Both pieces of Kapton tape were then pressed together to form a bilayer perovskite film consisting of a $CH_3NH_3PbI_3$ and a $CH_3NH_3PbBr_3$ layer on top of each other (FIGS. 16C and 16D). Kapton tape was used due to its reported temperature stability up to 260° C. and also because it mimics a transparent flexible substrate for thin film devices; in addition, Kapton tape is impermeable to gases.

The bilayer perovskite film sealed in Kapton tape was annealed at 75° C., 100° C., and 150° C. for 45 min each and at 200° C. for 3 days to ensure complete halide diffusion. FIGS. 16E and 16F depict each side of the bilayer film after 19 hours. FIGS. 16G and 16H depict each side of the bilayer perovskite film after 2 days, and FIGS. 16I and 16J depict each side of the bilayer perovskite film after 3 days. As can be seen from FIGS. 16E-16J, the coloring of the layers transitions from distinct colors for the iodide perovskite powder layer and the bromide perovskite powder layer to a single color for both sides of the layer, denoting a completed reaction.

Figure 17:
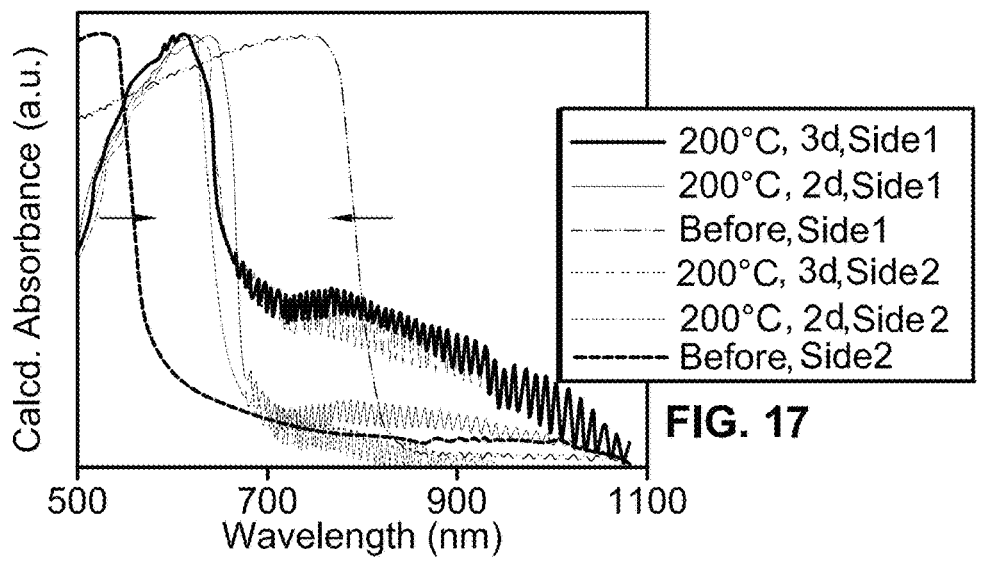
FIG. 17 depicts converging absorbance spectra for each side of the hybrid lead, mixed halide perovskite films made according to the disclosed solid phase synthesis method.
Figure 18A:
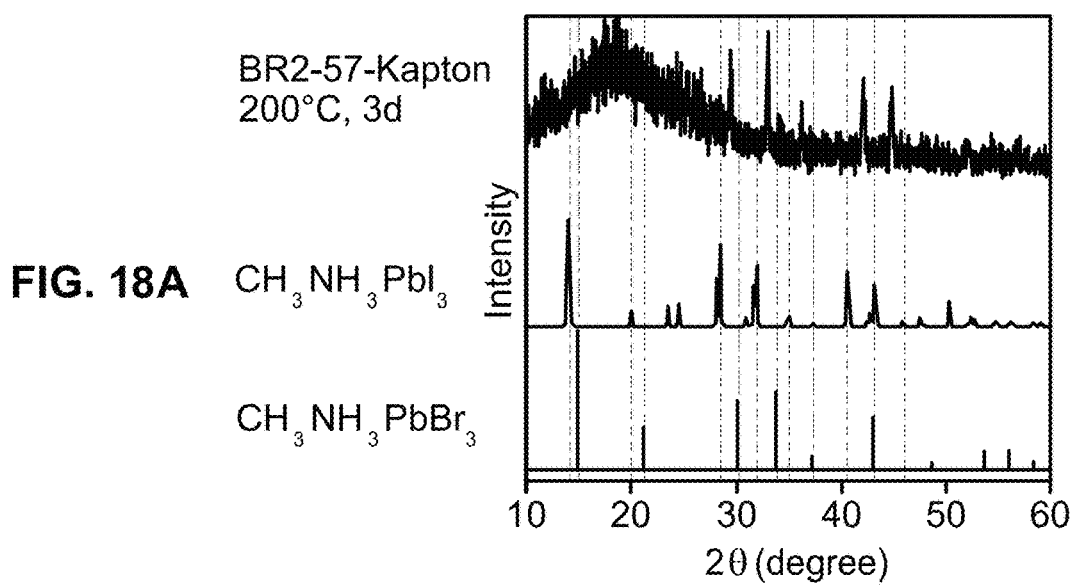
FIGS. 18A and 18B depict XRD data for a hybrid lead, mixed halide perovskites made according to the disclosed solid phase synthesis method.
Figure 18B:
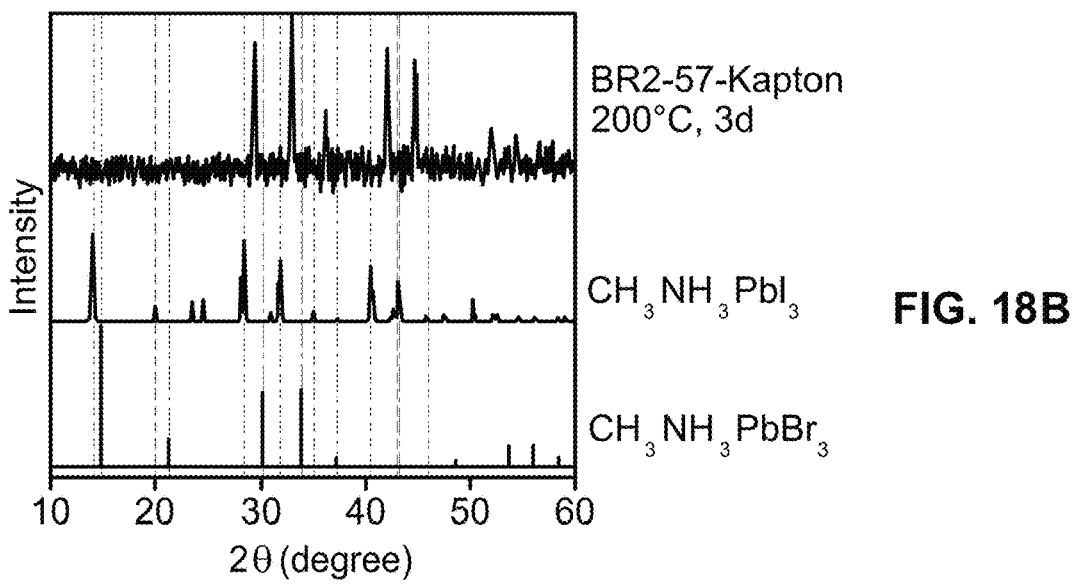

The reaction was monitored after annealing at 200° C. for different periods of time by collecting diffuse reflectance spectra for each side of the bilayer film. Diffuse reflectance spectra of solid films were measured with a SL1 Tungsten Halogen lamp (vis-IR), a SL3 Deuterium Lamp (UV), and a BLACK-Comet C-SR-100 spectrometer. FIG. 17 depicts the converging absorbance spectra for the single halide perovskite powders and the mixed halide powders. As can be seen in FIG. 17, the dot-dot-dash line and the heavy-weight dashed lines represent the outer bounds of the single halide perovskite precursors. The medium-weight solid line and the close-dashed line represent annealing after 2 days, and the converged heavy-weight solid line and spaced-dashed line represent the fully-reacted mixed-halide perovskite after annealing for 3 days. Once the absorption edges for both sides of the bilayer film merged together, the formation of the hybrid (mixed-halide) perovskite film was complete and confirmed by X-ray diffraction as shown in FIGS. 18A and 18B. In FIG. 18A, the Kapton tape produced a large, amorphous XRD peak from ~10-29°; in FIG. 18B, the Kapton peak has been removed.

Figures 19A, 19B:
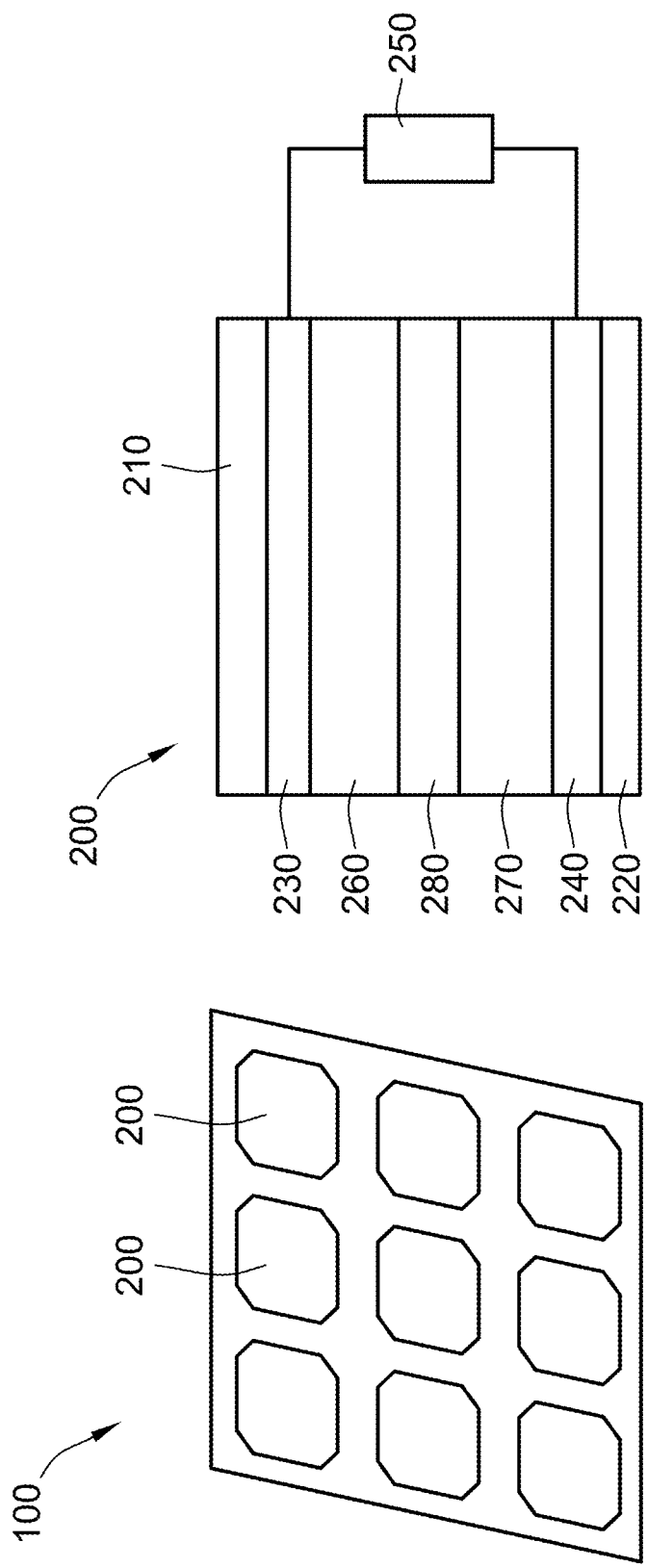
FIGS. 19A and 19B depict a solar panel, including a photovoltaic cell, which is comprised of a mixed-halide perovskite made according to the method disclosed herein and according to exemplary embodiments.

FIGS. 19A and 19B provide schematic depicts of an exemplary embodiment for the disclosed hybrid lead halide perovskites. In particular, FIG. 19A is a schematic representation of a solar panel 100 including a plurality of photovoltaic cells 200. The solar panel 100 is configured to convert light from the sun into electricity using the photovoltaic cells 200. FIG. 19B depicts a schematic representation of the layers of a photovoltaic cell 200. The photovoltaic cell 200 generally includes a transparent cover 210 that allows most of the sunlight that is usable by the photovoltaic cell 200 to pass therethrough, while protecting the photovoltaic cell from the weather. Additionally, the transparent cover 210 can include an antireflective coating (not shown) to prevent reflection of the sunlight from the photovoltaic cell 200. A backing layer 220 is located on the opposite side of the transparent cover 210 of the photovoltaic cell 200. Beneath the transparent cover 210 and above the backing layer 220 are a first contact strip 230 and a second contact strip 240, respectively. The first and second contact strips 230, 240 collect the current produced by the photovoltaic cell 200 such that it can be used to power a load 250. The current is generated in the photovoltaic cell 200 by an n-type semiconductor layer 260 and a p-type semiconductor layer 270 that are separated by a junction layer 280.

The hybrid lead perovskites (e.g., having the formulae $CH_3NH_3PbX_{3-a}X'_a$, $HC(NH_2)_2PbX_{3-a}X'_a$, $APbX_{3-a}X'_a$, and $A_{1-b}A'_bPbX_{3-a}X'_a$ in which X, X'=I, Br, Cl; A is an alkali earth metal, such as Rb or Cs; and A' is and organic cation, such as $CH_3NH_3$ or $HC(NH_2)_2$) made according to the disclosed methods are preferably used in the junction layer 280 of the photovoltaic cell 200.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of synthesizing a mixed-halide perovskite, comprising the steps of:
   mixing a first single-halide perovskite and a second single-halide perovskite to form a solid-phase mixture, wherein the first single-halide perovskite and the second single-halide perovskite are both in the solid phase during mixing; and
   heating the solid phase mixture at a temperature below a first decomposition temperature of the first single-halide perovskite and below a second decomposition temperature of the second single-halide perovskite for a time sufficient to form the mixed-halide perovskite;
   wherein the first-single halide perovskite and the second single-halide perovskite each comprise at least one of lead or tin.

2. The method of claim 1, wherein the heating step comprises forming the mixed-halide perovskite free of any semicrystalline phases.

3. The method of claim 1, further comprising the step of annealing the mixed-halide perovskite at a temperature of approximately 200° C. for between 1 hour and 72 hours.

4. A mixed-halide perovskite made according to the method of claim 1, wherein the mixed-halide perovskite is free of amorphous and/or semicrystalline phases.

5. A photovoltaic cell capable of powering an electrical load, the photovoltaic cell comprising:
   a transparent cover;
   an n-type semiconductor;
   a first electrical contact strip, the first electrical contact strip being disposed between the transparent cover and the n-type semiconductor and being in electrical communication with the n-type semiconductor;
   a p-type semiconductor;
   a junction layer disposed between the n-type semiconductor and the p-type semiconductor; and
   a second electrical contact strip, the second contact strip being in electrical communication with the p-type semiconductor,
   wherein the junction layer is comprised of a mixed-halide perovskite according to claim 4.

6. The photovoltaic cell of claim 5, wherein the mixed-halide perovskite has the formula $CH_3NH_3PbX_{3-a}X'_a$, wherein X and X' are selected from the group consisting of I, Br, and Cl, and wherein $0>a>3$.

7. The photovoltaic cell of claim 5, wherein the mixed-halide perovskite has the formula $HC(NH_2)_2PbX_{3-a}X'_a$, wherein X and X' are selected from the group consisting of I, Br, and Cl, and wherein $0>a>3$.

8. The photovoltaic cell of claim 5, wherein the mixed-halide perovskite has the formula $APbX_{3-a}X'_a$, wherein A is an alkali metal, wherein X and X' are selected from the group consisting of I, Br, and Cl, and wherein $0>a>3$.

9. The photovoltaic cell of claim 8, wherein A is Rb or Cs.

10. The photovoltaic cell of claim 5, wherein the mixed-halide perovskite has the formula $A_{1-b}A'_bPbX_{3-a}X'_a$, wherein A is Rb or Cs, A' is $CH_3NH_3$ or $HC(NH_2)_2$, and X and X' are selected from the group consisting of I, Br, and Cl, and wherein $0>a>3$.

11. The photovoltaic cell of claim 10, wherein A is Rb or Cs and A' is $CH_3NH_3$ or $HC(NH_2)_2$.

12. A solar panel comprised of one or more photovoltaic cells according to claim 5.

13. A method of synthesizing a mixed-halide perovskite, comprising the steps of:
   mixing a first single-halide perovskite and a second single-halide perovskite to form a solid-phase mixture, wherein the first single-halide perovskite and the second single-halide perovskite are both in the solid phase during mixing; and
   heating the solid phase mixture at a temperature below a first decomposition temperature of the first single-halide perovskite and below a second decomposition temperature of the second single-halide perovskite for a time sufficient to form the mixed-halide perovskite;
   wherein the heating step comprises forming a mixed-halide perovskite with a formula of $CH_3NH_3PbX_{3-a}X'_a$, wherein X and X' are selected from the group consisting of I, Br, and Cl, and wherein $0>a>3$.

14. The method of claim 13, wherein the heating step comprises heating the solid phase mixture to a temperature of approximately 200° C.

15. The method of claim 14, wherein the heating step comprises heating the solid phase mixture for between 0.5 and 1 hour.

16. A mixed-halide perovskite made according to the method of claim 13, wherein the mixed-halide perovskite is free of amorphous and/or semicrystalline phases.

17. A method of synthesizing a mixed-halide perovskite, comprising the steps of:
   mixing a first single-halide perovskite and a second single-halide perovskite to form a solid-phase mixture, wherein the first single-halide perovskite and the second single-halide perovskite are both in the solid phase during mixing; and heating the solid phase mixture at a temperature below a first decomposition temperature of the first single-halide perovskite and below a second decomposition temperature of the second single-halide perovskite for a time sufficient to form the mixed-halide perovskite;

wherein the heating step comprises forming a mixed-halide perovskite with a formula of $HC(NH_2)_2PbX_{3-a}X'_a$, wherein X and X' are selected from the group consisting of I, Br, and Cl, and wherein $0>a>3$.

18. A mixed-halide perovskite made according to the method of claim 17, wherein the mixed-halide perovskite is free of amorphous and/or semicrystalline phases.

19. A method of synthesizing a mixed-halide perovskite, comprising the steps of:

mixing a first single-halide perovskite and a second single-halide perovskite to form a solid-phase mixture, wherein the first single-halide perovskite and the second single-halide perovskite are both in the solid phase during mixing; and heating the solid phase mixture at a temperature below a first decomposition temperature of the first single-halide perovskite and below a second decomposition temperature of the second single-halide perovskite for a time sufficient to form the mixed-halide perovskite;

wherein the heating step comprises forming a mixed-halide perovskite with a formula of $APbX_{3-a}X'_a$, wherein A is an alkali metal, wherein X and X' are selected from the group consisting of I, Br, and Cl, and wherein $0>a>3$.

20. The method of claim 19, wherein the step of forming a mixed-halide perovskite includes selecting A to be Rb or Cs.

21. A mixed-halide perovskite made according to the method of claim 19, wherein the mixed-halide perovskite is free of amorphous and/or semicrystalline phases.

22. The mixed-halide perovskite of claim 21, wherein A is Rb or Cs.

23. A method of synthesizing a mixed-halide perovskite, comprising the steps of:

mixing a first single-halide perovskite and a second single-halide perovskite to form a solid-phase mixture, wherein the first single-halide perovskite and the second single-halide perovskite are both in the solid phase during mixing; and heating the solid phase mixture at a temperature below a first decomposition temperature of the first single-halide perovskite and below a second decomposition temperature of the second single-halide perovskite for a time sufficient to form the mixed-halide perovskite;

wherein the heating step comprises forming a mixed-halide perovskite with a formula of $A_{1-b}A'_bPbX_{3-a}X'_a$, wherein A is an alkali metal and A' is an organic cation, wherein X and X' are selected from the group consisting of I, Br, and Cl, and wherein $0>a>3$.

24. The method of claim 23, wherein the step of forming a mixed-halide perovskite with a formula of $A_{1-b}A'_bPbX_{3-a}X'_a$ comprises selecting A to be Rb or Cs and A' to be $CH_3NH_3$ or $HC(NH_2)_2$.

25. A mixed-halide perovskite made according to the method of claim 23, wherein the mixed-halide perovskite is free of amorphous and/or semicrystalline phases.

26. The mixed-halide perovskite of claim 25, wherein A is Rb or Cs and A' is $CH_3NH_3$ or $HC(NH_2)_2$.

* * * * *